US012667013B2

(12) United States Patent
Zhu et al.

(10) Patent No.: US 12,667,013 B2
(45) Date of Patent: Jun. 23, 2026

(54) DEVICE INCLUDING A CHIPSET AND AN ANTI-VULCANIZATION FILM

(71) Applicant: FOSHAN NATIONSTAR OPTOELECTRONICS CO., LTD., Foshan (CN)

(72) Inventors: Mingjun Zhu, Foshan (CN); Junzheng Li, Foshan (CN); Yan Chen, Foshan (CN); Meiqin Lei, Foshan (CN); Gaohui Wang, Foshan (CN); Zishan Lu, Foshan (CN); Danwei Li, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 629 days.

(21) Appl. No.: 18/090,625

(22) Filed: Dec. 29, 2022

(65) Prior Publication Data

US 2023/0215847 A1 Jul. 6, 2023

(30) Foreign Application Priority Data

Dec. 31, 2021 (CN) ......................... 202111677433.7
Dec. 31, 2021 (CN) ......................... 202111677526.X

(51) Int. Cl.
*H10W 90/00* (2026.01)
*H10H 20/01* (2025.01)
*H10H 20/852* (2025.01)

(52) U.S. Cl.
CPC ............ *H10W 90/00* (2026.01); *H10H 20/01* (2025.01); *H10H 20/852* (2025.01)

(58) Field of Classification Search
CPC .............. H01L 25/0753; H10H 20/852; H10H 20/0362

(Continued)

(56) References Cited

U.S. PATENT DOCUMENTS

2011/0204389 A1* 8/2011 Kasakura ........... C09K 11/7734
257/E33.061
2017/0299129 A1* 10/2017 Lai ..................... H10H 20/8581
(Continued)

FOREIGN PATENT DOCUMENTS

CN 104037132 A 9/2014
CN 105842611 A 8/2016
(Continued)

OTHER PUBLICATIONS

2nd Chinese Office Action for Chinese Application No. 202111677433.7, dated Apr. 3, 2024 (Apr. 3, 2024)—8 pages (English Translation—8 pages).

(Continued)

*Primary Examiner* — Eliseo Ramos Feliciano
*Assistant Examiner* — Mikka Liu
(74) *Attorney, Agent, or Firm* — CM Law; Stephen J. Weed

(57) ABSTRACT

Provided are a method for machining a device and the device. The method for machining a device includes die bonding, primary dicing, filling by a baffle wall material, grinding and secondary dicing. In the step of grinding machining, a semi-finished product is placed on a platform surface of a grinding and fixing platform, a grinding working end of a grinding device is controlled to operate, and with the platform surface of the grinding and fixing platform as a height reference, the grinding working end grinds from above the semi-finished product toward the grinding and fixing platform and operates to a preset height. Through the special machining process, the probability of the appearance of white glue on a top surface of the device is reduced, which is conducive to ensuring a production yield of the device.

19 Claims, 13 Drawing Sheets

(58) Field of Classification Search
USPC ...................................................... 257/88–89
See application file for complete search history.

(56) References Cited

U.S. PATENT DOCUMENTS

| | | | | |
|---|---|---|---|---|
| 2018/0233492 | A1* | 8/2018 | Liu ...................... | H10H 20/857 |
| 2018/0277725 | A1 | 9/2018 | Xiong | |
| 2019/0355883 | A1* | 11/2019 | Yeh ..................... | H10H 20/8506 |
| 2022/0158048 | A1* | 5/2022 | Park ...................... | F21S 43/255 |

FOREIGN PATENT DOCUMENTS

| | | |
|---|---|---|
| CN | 205508878 U | 8/2016 |
| CN | 106410022 A | 2/2017 |
| CN | 109728153 A | 5/2017 |
| CN | 107984375 A | 5/2018 |
| CN | 109129036 A | 1/2019 |
| CN | 111987080 A | 11/2020 |
| CN | 112117204 A | 12/2020 |
| CN | 212848472 U | 3/2021 |
| CN | 112838012 A | 5/2021 |
| CN | 113458877 A | 10/2021 |
| CN | 214956882 U | 11/2021 |

OTHER PUBLICATIONS

Translated Chinese First Office Action, App. No. 202111677433.7, dated Aug. 10, 2023, pp. 1-18.

Translated Search Report, App. No. 202111677433.7, dated Aug. 9, 2023, pp. 1-6.

Translated Chinese First Office Action, App. No. 202111677526.X, dated Jun. 30, 2023, pp. 1-8.

Translated Search Report, App. No. 202111677526.X, dated Jun. 27, 2023, pp. 1-4.

* cited by examiner

Die bonding — 101

Encapsulating by an encapsulation material — 102

Primary dicing — 103

Primary vulcanization machining — 107

Filling by a baffle wall material — 104

Secondary vulcanization machining — 108

Grinding — 105

Secondary dicing — 106

DEVICE INCLUDING A CHIPSET AND AN ANTI-VULCANIZATION FILM

CROSS-REFERENCE TO RELATED APPLICATION(S)

This application claims priority to Chinese Patent Application No. 202111677433.7 filed on Dec. 31, 2021 and entitled METHOD FOR MACHINING A DEVICE AND DEVICE and claims priority to Chinese Patent Application No. 202111677526.X filed on Dec. 31, 2021 and entitled DEVICE AND METHOD FOR MACHINING THE SAME, the disclosure of each of which is incorporated herein by reference in its entirety.

TECHNICAL FIELD

The present disclosure relates to the field of device machining technology and, in particular, to a method for machining a device and the device.

BACKGROUND

To limit a light-emitting angle of a light-emitting device, the light-emitting device generally blocks large-angle emitting light and limits the light-emitting angle of the device by using a baffle wall structure. In a manufacturing process of this type of light-emitting device, since a baffle wall material is filled in a channel, a colloid may overflow the channel, resulting in the appearance of white glue on a top surface of a white glue encapsulation colloid, which affects the normal light emission of the device so that a requirement for the quality of the device cannot be met.

SUMMARY

To solve the issues such as prone adhesion and vulcanization on a surface of an existing sensing device, the present disclosure provides a device and a method for machining the device. In a manufacturing process of the device, the probability of the appearance of white glue on a top surface of the device is reduced through a grinding process, ensuring a production yield of the device.

According to an aspect of the present disclosure, a method for machining a device is provided. The method includes die bonding, encapsulating by an encapsulation material, primary dicing, filling by a baffle wall material, grinding and secondary dicing.

The die bonding comprises that multiple chipsets are disposed on a main circuit board in an array, where each of the multiple chipsets includes multiple chips.

The encapsulating by the encapsulation material comprises that the multiple chipsets are integrally encapsulated by the encapsulation material to form a main encapsulation layer after the encapsulation material is cured.

The primary dicing comprises that the main encapsulation layer is cut by a first cutting blade having a width of a in gaps of the multiple chipsets according to a preset primary dicing track to obtain a channel structure, where the channel structure divides the main encapsulation layer into multiple sub-encapsulation layers.

The filling by the baffle wall material comprises that the channel structure is filled with the baffle wall material to form a main baffle wall in the channel structure after the baffle wall material is cured, where the main circuit board, the multiple chipsets, the multiple sub-encapsulation layers and the main baffle wall are combined to form a semi-finished product.

The grinding comprises that the semi-finished product is placed on a platform surface of a grinding and fixing platform, a grinding working end of a grinding device is controlled to operate, and with the platform surface of the grinding and fixing platform as a height reference, the grinding working end grinds from above the semi-finished product toward the grinding and fixing platform and operates to a preset height.

The secondary dicing comprises that the main baffle wall and the main circuit board are cut through by a second cutting blade having a width of b according to the preset primary dicing track so that the main baffle wall is cut into multiple groups of sub-baffle walls, and the main circuit board is cut into multiple sub-circuit boards, where b<a.

According to another aspect of the present disclosure, a device is provided. The device includes a sub-circuit board, a chipset, a sub-encapsulation layer, a sub-side anti-vulcanization film, a sub-baffle wall and a sub-top anti-vulcanization film. The chipset includes multiple chips, where the multiple chips are separately bonded on the sub-circuit board and encapsulated based on the sub-encapsulation layer. A bottom surface contour of the sub-encapsulation layer is located in a region surrounded by an edge contour of the sub-circuit board. The sub-side anti-vulcanization film covers an outer side surface of the sub-encapsulation layer, extends from a bottom of the outer side surface of the sub-encapsulation layer toward an edge of the sub-circuit board and covers a top surface of the sub-circuit board. An outer side surface of the sub-side anti-vulcanization film is surrounded by the sub-baffle wall. The sub-top anti-vulcanization film covers a top surface of the sub-encapsulation layer, a top surface of the sub-side anti-vulcanization film and a top surface of the sub-baffle wall.

In an implementation, before the filling by the baffle wall material, the method further includes primary vulcanization processing. The primary vulcanization processing comprises that in the channel structure, an anti-vulcanization material is sprayed on an outer side surface of one of the multiple sub-encapsulation layers and a top surface of a position of the main circuit board corresponding to the channel structure through a spraying process, and the anti-vulcanization material forms a main-side anti-vulcanization film.

In an implementation, after the grinding, the method further includes secondary vulcanization processing. The secondary vulcanization processing comprises that an anti-vulcanization material is sprayed on a sprayed top surface to form a main-top anti-vulcanization film covering the sprayed top surface, where the sprayed top surface consists of a top surface of the main baffle wall and a top surface of each of the multiple sub-encapsulation layers.

In an implementation, the grinding working end is a grinding wheel with a grinding surface parallel to the grinding and fixing platform.

In an implementation, the grinding wheel is a resin grinding wheel.

In an implementation, the mesh number of the grinding wheel is in a range of [500, 1000].

In an implementation, a rotational speed of the grinding wheel in an operating state is in a range of [600 rpm, 800 rpm].

In an implementation, a feed rate of the grinding wheel when the grinding wheel grinds from above the semi-finished product toward the grinding and fixing platform and operates to the preset height is in a range of [0.1 μm/s, 0.3 μm/s].

In an implementation, the grinding further includes that: the grinding working end grinds from above the semi-finished product toward the grinding and fixing platform and operates to the preset height through multiple sub-steps, where each sub-step of the multiple sub-steps includes adjusting a trimming device, polishing by the grinding device and feed grinding. The adjusting the trimming device comprises that with the platform surface of the grinding and fixing platform as the height reference, a height of a trimming surface of the trimming device is adjusted to be the same as a theoretical height corresponding to the sub-step. The polishing by the grinding device comprises that the grinding device is driven to operate to a position above the trimming device located outside the grinding and fixing platform, the grinding device is driven to work, and the grinding surface of the grinding device is enabled to operate to the theoretical height, where the grinding surface coincides with the trimming surface. The feed grinding comprises that the grinding device is driven to translate to a position above the grinding and fixing platform. In each sub-step, the grinding surface of the grinding working end operates to a corresponding theoretical height, and in a last performed sub-step, the grinding surface of the grinding working end operates to the preset height.

In an implementation, the grinding and fixing platform is provided with multiple vacuum suction cups, and a top surface of the multiple vacuum suction cups is used as the platform surface of the grinding and fixing platform.

In an implementation, after the grinding, the method for machining a device further includes the following: roughness detection is performed on a top surface of the semi-finished product after the grinding; the secondary dicing is performed when the top surface of the semi-finished product after the grinding has a roughness of less than or equal to 0.5; and the grinding is performed again when the top surface of the semi-finished product after the grinding has a roughness of greater than 0.5.

In an implementation, the grinding and fixing platform is a suction cup.

In an implementation, the channel structure includes multiple sub-channels, where in a radial section of one sub-channel of the multiple sub-channels, a width of a bottom of the sub-channel is less than a width of a top of the sub-channel.

In an implementation, in a radial section of one sub-channel of the multiple sub-channels, a width of the sub-channel gradually increases from a bottom to a top of the sub-channel.

In an implementation, in a radial section of one sub-channel of the multiple sub-channels, a minimum value of a width of a bottom of the sub-channel is 0.1 mm, and a width of a top of the sub-channel is greater than the width of the bottom of the sub-channel, where a minimum value of a difference value between the width of the top of the sub-channel and the width of the bottom of the sub-channel is 0.03 mm.

In an implementation, a minimum value of a thickness of one sub-baffle wall of the multiple groups of sub-baffle walls is 0.1 mm.

In an implementation, the anti-vulcanization material is a silicone resin material.

In an implementation, the baffle wall material is a silicone resin material mixed with titanium dioxide.

In an implementation, the encapsulation material is one of a silicone resin, a silica gel and an epoxy resin.

In an implementation, one of the multiple chipsets includes a red light chip, a green light chip and an infrared light chip.

To conclude, the present disclosure provides the method for machining a device and the device. After the semi-finished product is manufactured, the top of the semi-finished product is ground through the grinding process to remove a baffle wall material overflowing to a top of the main encapsulation layer, reducing the probability of the appearance of the baffle wall material on the top surface of the main encapsulation layer in a semi-finished product stage and improving the production yield of the device product. The grinding and fixing platform is designed as the suction cup, ensuring the uniformity of the height reference and improving the grinding accuracy. Correspondingly, the grinding surface of the grinding device may be timely trimmed by the trimming device before and during the operating process, which can further improve the grinding accuracy and has a beneficial effect on improving the molding quality of the device product.

It is to be understood that the content described in this part is neither intended to identify key or important features of embodiments of the present disclosure nor intended to limit the scope of the present disclosure. Other features of the present disclosure are apparent from the description provided hereinafter.

BRIEF DESCRIPTION OF DRAWINGS

To illustrate technical solutions in embodiments of the present disclosure more clearly, drawings used in description of the embodiments are briefly described below. Apparently, the drawings described below illustrate only part of the embodiments of the present disclosure, and those of ordinary skill in the art may obtain other drawings based on the drawings described below on the premise that no creative work is done.

DETAILED DESCRIPTION

For a better understanding of the technical schemes by those skilled in the art, the schemes in embodiments of the present disclosure will be described clearly and completely in conjunction with the drawings in embodiments of the present disclosure. Apparently, the embodiments described below are part, not all, of the embodiments of the present disclosure. Based on the embodiments described herein, all other embodiments obtained by those of ordinary skill in the art on the premise that no creative work is done are within the scope of the present disclosure.

It is to be noted that the terms "first", "second" and the like in the description, claims and drawings of the present disclosure are used to distinguish between similar objects and are not necessarily used to describe a particular order or sequence. It is to be understood that the data used in this way is interchangeable where appropriate so that the embodiments of the present disclosure described herein may also be implemented in a sequence not illustrated or described herein. In addition, the terms "include", "have" or any other variations thereof are intended to encompass a non-exclusive inclusion. For example, a process, method, system, product or equipment that includes a series of steps or units not only includes the expressly listed steps or units but may also include other steps or units that are not expressly listed or are inherent to such process, method, product or equipment.

Figure 1:
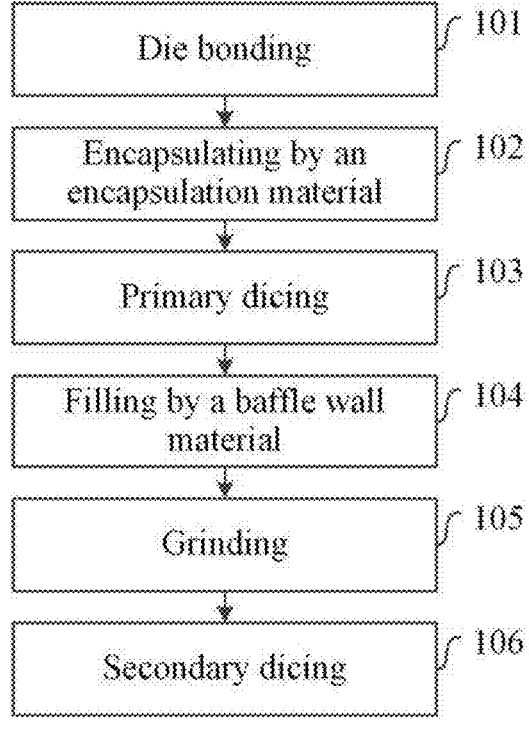
FIG. 1 is a flowchart of a method for machining a device according to an embodiment of the present disclosure.

FIG. 1 is a flowchart of a method for machining a device according to an embodiment of the present disclosure.

The embodiment of the present disclosure provides a method for machining a device. The method includes the steps below.

S101 is die bonding.

Multiple chipsets are fixed on a main circuit board in an array, where each of the multiple chipsets includes multiple chips. A chipset refers to multiple chips required for composing a device. In an implementation, the multiple chips included in the chipset are a red light chip, a green light chip and an infrared light chip, respectively. In an implementation, this type of device having the red light chip, the green light chip and the infrared light chip may be applied to the field of human body sensing.

In an implementation, after the die bonding is completed, wire bonding may be required according to different types of chips. In an implementation, if some chips in the multiple chipsets have top surface pins, each top surface pin is electrically connected to the main circuit board through the wire bonding process.

In an implementation, if a type of some chips in the multiple chipsets is a vertical chip or a formal chip, the some chips have the top surface pins. The top surface pin requires to be electrically connected to a corresponding position of the main circuit board through the wire bonding process to achieve a corresponding electrical conduction function.

If all chips in the multiple chipsets are flip chips, no wire bonding is required, and the chips may be electrically connected to the main circuit board in the step of die bonding.

S102 is encapsulating by an encapsulation material.

The multiple chipsets are integrally encapsulated by the encapsulation material, and the encapsulation material is cured into a main encapsulation layer. In an implementation, shaping and encapsulation are generally achieved through injection molding of the encapsulation material into a mold cavity, and after the encapsulation material is cured, a main encapsulation layer wrapping the multiple chipsets may be formed.

Figure 2:
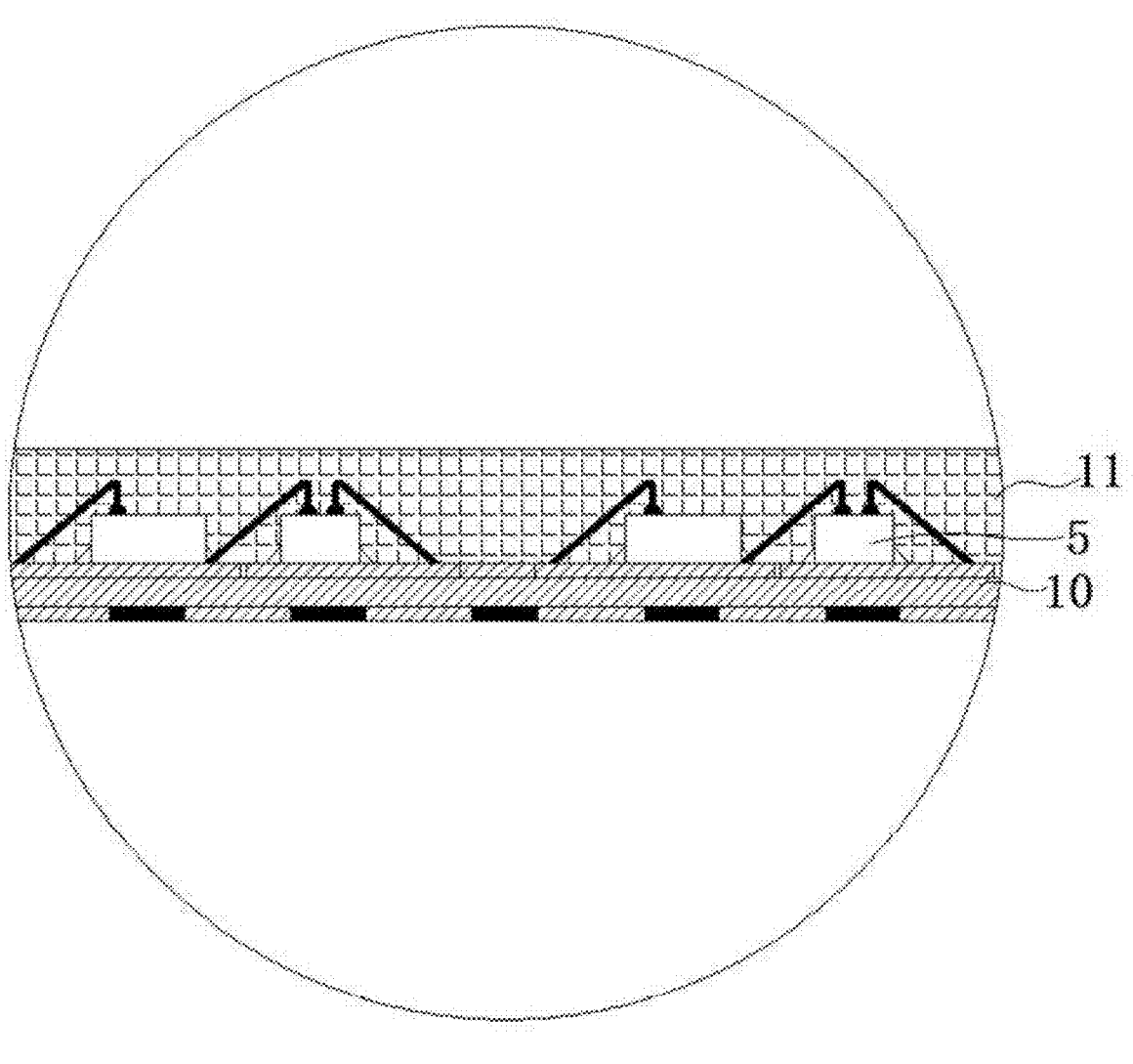
FIG. 2 is a partial sectional view of a full-board device according to an embodiment of the present disclosure.

FIG. 2 is a partial sectional view of a full-board device according to an embodiment of the present disclosure. In an implementation, after steps S101 and S102 are performed, a full-board device is obtained through machining. In the full-board device, multiple chips 5 are bonded on a main circuit board 10, and a main encapsulation layer 11 encapsulates all the chips 5. In an implementation, the improvement of the method for machining a device in the embodiment of the present disclosure is mainly based on a subsequent machining process of the full-board device defined by the embodiment of the present disclosure. Therefore, the method for machining a device according to the embodiment of the present disclosure is described based on the defined structure of the full-board device in the embodiment of the present disclosure.

In an implementation, the encapsulation material is a silicone resin, a silica gel, an epoxy resin or the like. For a specific usage scenario of the device, the encapsulation material used by the full-board device provided in the embodiment of the present disclosure is the silicone resin.

In the present embodiment, the encapsulation material has a hardness of 45 to 55 D and may be a silicone resin, a silica gel or an epoxy resin.

S103 is primary dicing.

Figure 3:
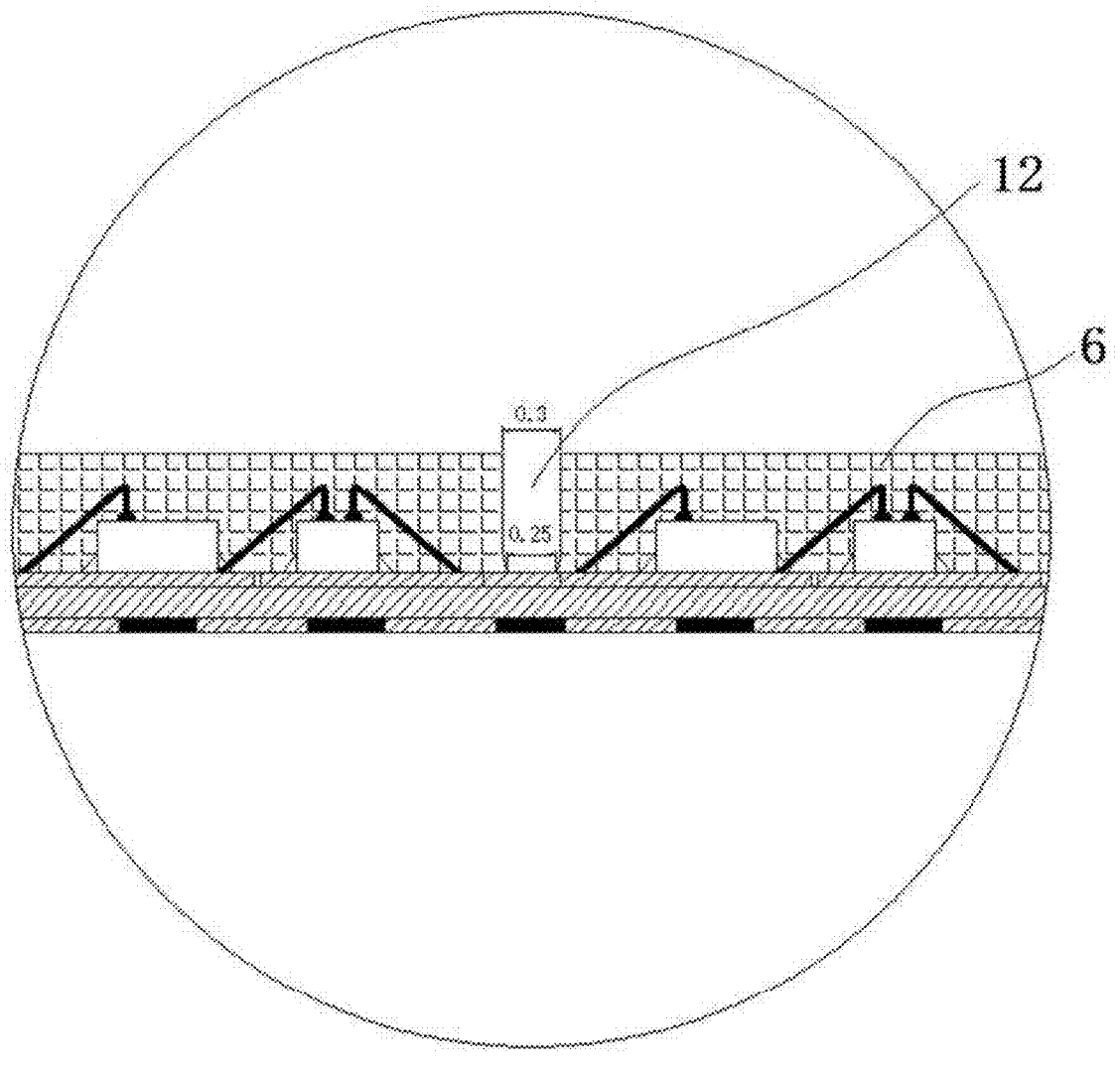
FIG. 3 is a partial sectional view of a channel structure according to an embodiment of the present disclosure.

FIG. 3 is a partial sectional view of a channel structure after primary dicing according to an embodiment of the present disclosure.

The main encapsulation layer is cut by a first cutting blade having a width of a in gaps of the multiple chipsets according to a preset primary dicing track to obtain a channel structure 12, where the channel structure divides the main encapsulation layer into multiple sub-encapsulation layers 6. It is to be noted that a diced object of the primary dicing is the main encapsulation layer, the primary dicing track may be understood as a cutting track of the first cutting blade (excluding a cutting depth of the first cutting blade), and the cutting depth requires to be set according to a specific thickness of the main encapsulation layer.

In an implementation, the dicing device is used for cutting the main encapsulation layer 11 through a cutting process to obtain the channel structure 12, and since the devices according to the embodiment of the present disclosure have a structural feature of being arranged on the channel in an array, the obtained channel structure 12 is grid-shaped.

In an implementation, the grid-shaped channel structure 12 divides the main encapsulation layer 11 into multiple sub-encapsulation layers, and any one of the multiple chipsets is encapsulated based on a corresponding one of the multiple sub-encapsulation layers, where one chipset and a sub-encapsulation layer corresponding to the one chipset correspond to one device.

In an implementation, the channel structure 12 includes multiple sub-channels, where in a radial section of any one of the multiple sub-channels, a width of a bottom of the sub-channel is less than a width of a top of the sub-channel. In an implementation, in the radial section of any one of the multiple sub-channels, a width of the sub-channel gradually increases from the bottom to the top of the sub-channel, that is, a sidewall of the sub-channel is a slope.

In an implementation, when a required thickness of a sub-baffle wall is constant, the greater the width of the section of the channel obtained through the primary dicing, the more the baffle wall material which requires to be filled, and the more the baffle wall material which requires to be cut and discarded. Therefore, in conjunction with the above factors, in an implementation, a minimum value of the thickness of the sub-baffle wall is 0.1 mm, and the width of the section of the channel is designed according to a requirement of the thickness of the sub-baffle wall.

S104 is filling by a baffle wall material.

Figure 4:
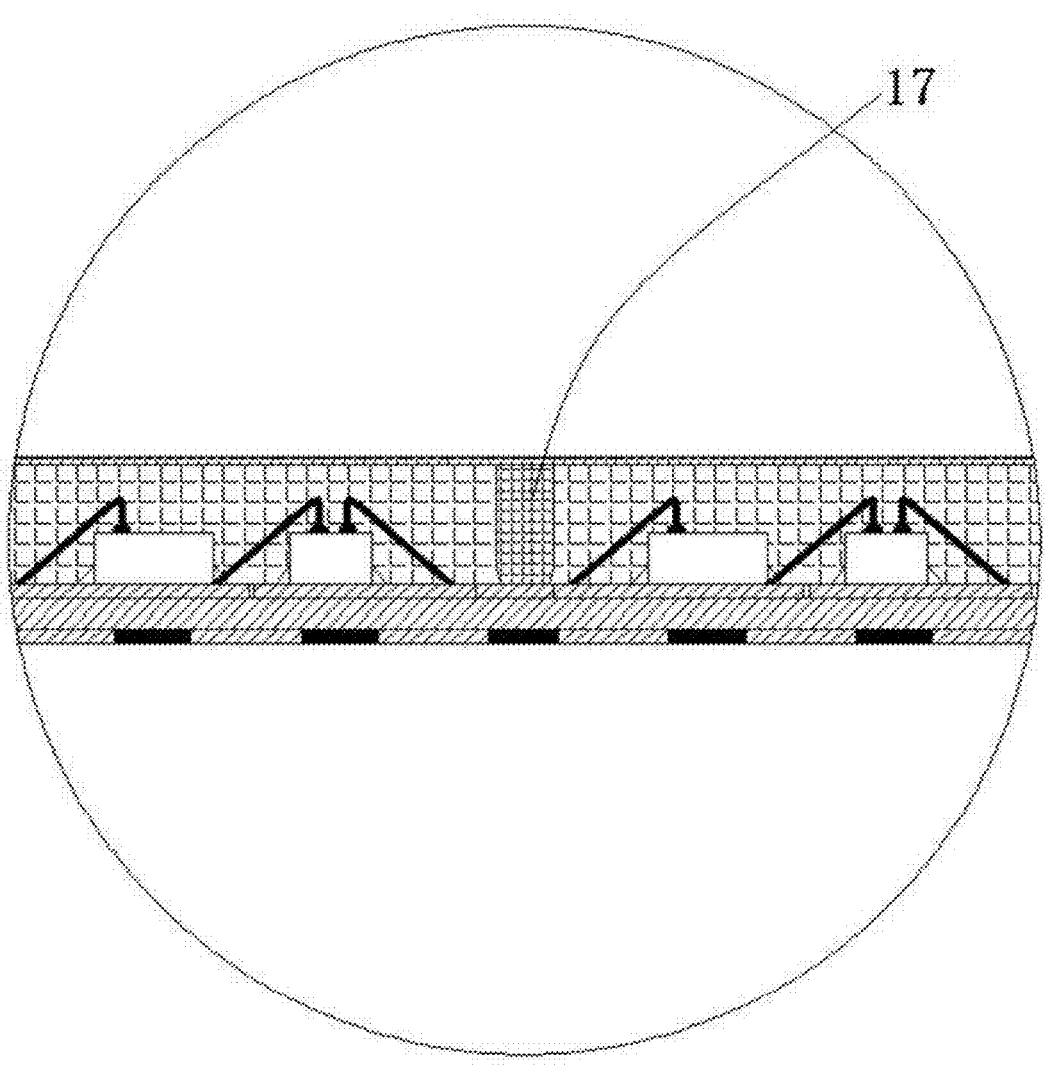
FIG. 4 is a partial sectional view of a semi-finished product of a device after being encapsulated by a baffle wall material according to an embodiment of the present disclosure.

FIG. 4 is a partial sectional view of a semi-finished product of a device after being encapsulated by a baffle wall material according to an embodiment of the present disclosure. In conjunction with FIG. 4, the channel structure 12 is filled with the baffle wall material, and the baffle wall material is cured into a main baffle wall 17 in the channel structure 12. The baffle wall material is used for filling the channel structure, the baffle wall material is cured into the main baffle wall 17, and the main circuit board, the multiple chipsets, the multiple sub-encapsulation layers and the main baffle wall are combined to form a semi-finished product.

A top surface of the main baffle wall 17 and a top surface of each of the multiple sub-encapsulation layers are combined to form a sprayed top surface as a spraying carrying surface in a subsequent spraying process. Since the spraying process is characterized in that a thin film structure is formed on a surface of an object, according to a requirement for structure of the device, in the embodiment of the present disclosure, the channel structure 12 is filled with the baffle wall material.

Correspondingly, the filling of the baffle wall material may be implemented through compression molding or the like, and the top surface of the main baffle wall 17 formed through the curing of the baffle wall material is kept at the same height with the top surface of each of the multiple sub-encapsulation layers so that a flat sprayed top surface is formed.

It is to be noted that for the structure of the main baffle wall 17 formed through the compression molding or the like, a portion of the baffle wall material may be molded on a top surface of the main encapsulation layer due to a pressure of the compression molding and the problem of the fit of a mold and the main encapsulation layer. Generally, after the structure the main baffle wall is molded, a top surface of the semi-finished product of the device requires to be ground through grinding or the like, so as to remove the baffle wall material on the top surface of the main encapsulation layer and avoid blocking the light emission of the device.

In an implementation, the channel structure is also generally filled with the baffle wall material through injection molding of the baffle wall material into a mold cavity. To prevent an injection molding device from extruding the main encapsulation layer, a mold forming the mold cavity has a relatively small pressure when the mold fits snugly around the main encapsulation layer, or the mold is not in contact with the main encapsulation layer, which causes the baffle wall material to inevitably overflow from the channel structure to the top surface of the main baffle wall during filling the baffle wall material. Therefore, in the semi-finished product obtained after being encapsulated by the baffle wall material, the structure of the main encapsulation layer, the structure of the baffle wall material and a mutual position between the main encapsulation layer and the baffle wall material are uncertain. To ensure the stability of a structure of a manufactured product, the semi-finished product is subsequently processed through the grinding process.

It is to be noted that due to the implementation of the grinding process, a certain margin should be reserved for a design of an initial thickness of the main encapsulation layer, that is, compared with a conventional process, the initial encapsulation thickness of the main encapsulation layer is relatively large.

In an implementation, the baffle wall material is a silicone resin material containing titanium dioxide. On the one hand, the baffle wall material is the silicone resin material, ensuring the compactness of the combination of the baffle wall material and the encapsulation material. On the other hand, the titanium dioxide can provide higher light reflectance and improve the light emission efficiency of the device.

In an implementation, the above method for machining a device is an ideal machining manner. In an implementation process, the step of filling by the baffle wall material is generally achieved through molding. Due to an individual difference in height of the device, a matching difference between the mold and the semi-finished product or the like, the baffle wall material may cover the top surface of the semi-finished product after the baffle wall material is molded through the molding machining. To ensure the penetration of light, the baffle wall material covering the top surface of the semi-finished product requires to be removed.

In an implementation, a technical means for removing the excess baffle wall material is the grinding.

S105 is grinding.

In an implementation, after the filling of the baffle wall material, the semi-finished product is placed on a grinding and fixing platform, a grinding working end of a grinding device is controlled to operate, and with a height of the grinding and fixing platform as a reference, the grinding working end grinds from above the semi-finished product toward the grinding and fixing platform and operates to a preset height.

Figure 5:
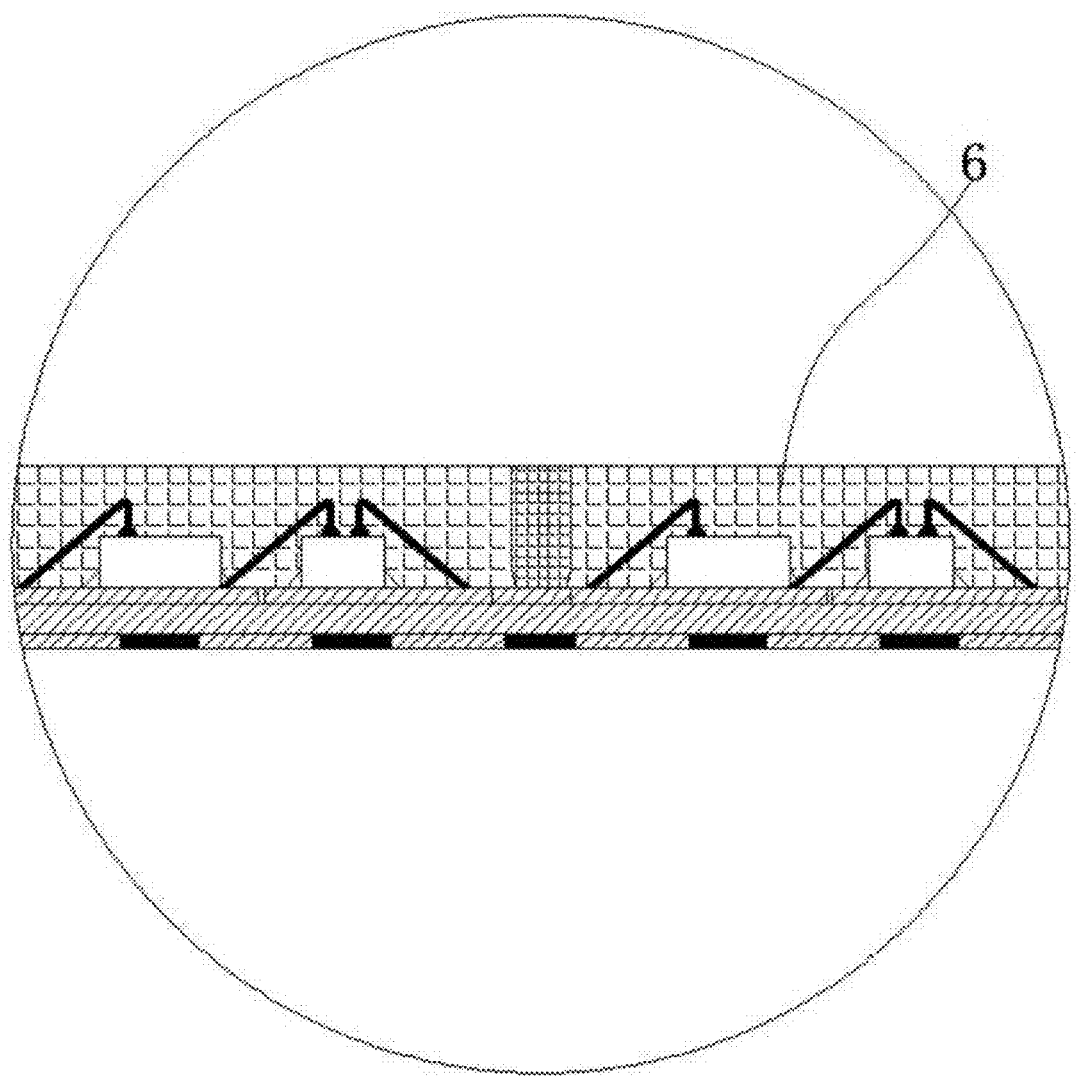
FIG. 5 is a partial sectional view of a semi-finished product after a step of grinding according to an embodiment of the present disclosure.

In an implementation, for the grinding device, if no related feedback is set, a motion drive of the grinding device is substantially independent of the ground object (i.e., the semi-finished product according to the embodiment of the present disclosure). FIG. 5 is a partial sectional view of a semi-finished product after a step of grinding according to an embodiment of the present disclosure. In conjunction with FIG. 5, in this step, after the semi-finished product is placed on the grinding and fixing platform, the grinding device is driven to operate according to a set program, and with the height of the grinding and fixing platform as the reference, the grinding working end is started and operates to the preset height. Through this implementation, the main encapsulation layer and the main baffle wall 17 of the semi-finished product may theoretically be ground to the preset height.

S106 is secondary dicing.

Figure 6:
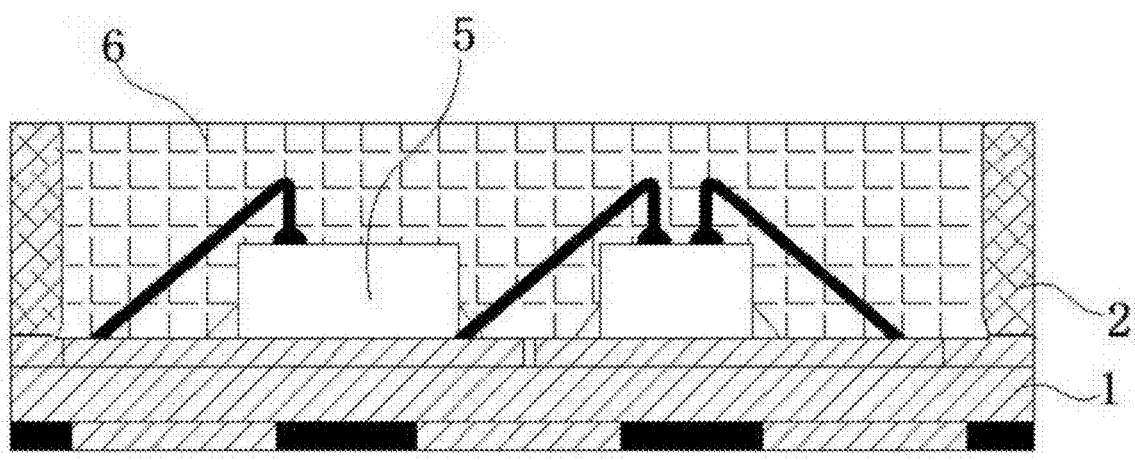
FIG. 6 is a sectional view of a device according to an embodiment of the present disclosure.

Referring to a sectional view of a single device shown in FIG. 6, the main baffle wall 17 and the main circuit board 10 are cut through by a cutting process, the main baffle wall 17 is cut into multiple groups of sub-baffle walls, and the main circuit board 10 is cut into multiple sub-circuit boards 1. After the secondary dicing, the full-board device is cut into single devices having a specific structure. In the single device, the baffle wall material is molded at a corresponding position. The single device includes a sub-circuit board 1, a chipset, a sub-encapsulation layer 6 and a sub-baffle wall 2. To distinguish the naming of the components of the device from the naming of some structures in a subsequent machining method, a corresponding prefix is added to the naming of the components of the device.

In an implementation, the chipset includes multiple chips 5, where the multiple chips 5 are separately bonded on the sub-circuit board 1 and encapsulated based on the sub-encapsulation layer 6. In an implementation, an encapsulated object of the sub-encapsulation layer 6 includes, in addition to the chip 5, related structures involved in the chip, such as a bonding wire. A type and a disposition position of the chip 5 require to be set according to a requirement of the device. In an implementation, the chipset may be a sensing chipset including the red light chip, the green light chip and the infrared light chip.

In an implementation, a bottom surface contour of the sub-encapsulation layer 6 is located in a region surrounded by an edge contour of the sub-circuit board 1. Affected by a machining process and compared with a conventional device, the bottom surface contour of the sub-encapsulation layer 6 is located in the region surrounded by the edge contour of the sub-circuit board 1, that is, no point on the bottom surface contour of the sub-encapsulation layer 6 exceeds the region surrounded by the edge contour of the sub-circuit board 1, and a top surface of the sub-circuit board 1 is not covered by the sub-encapsulation layer 6 from the bottom surface contour of the sub-encapsulation layer 6 to an edge contour of the circuit board.

According to a track of the secondary dicing and the structure of the single device obtained through the cutting, for the single device, there is always a cutting mark on a cut surface of the material. In the embodiment of the present disclosure, a cutting position of the secondary dicing does not affect a specific function of the device, such as the protection of a vulcanization material to the encapsulation material and the restriction of an inner side of the baffle wall material to a light-emitting angle of the chip.

To conclude, the present disclosure provides the method for machining a device and the device. After the semi-finished product is manufactured, the top of the semi-finished product is ground through the grinding process to remove the baffle wall material overflowing to the top of the main encapsulation layer, reducing the probability of the appearance of the baffle wall material on the top surface of the main encapsulation layer in a semi-finished product stage and improving a production yield of the device product. The grinding and fixing platform is designed as a suction cup, ensuring the uniformity of the height reference and improving the grinding accuracy. Correspondingly, a grinding surface of the grinding device may be timely trimmed by a trimming device before and during an operating process, which can further improve the grinding accuracy and has a beneficial effect on improving the molding quality of the device product.

Figure 7:
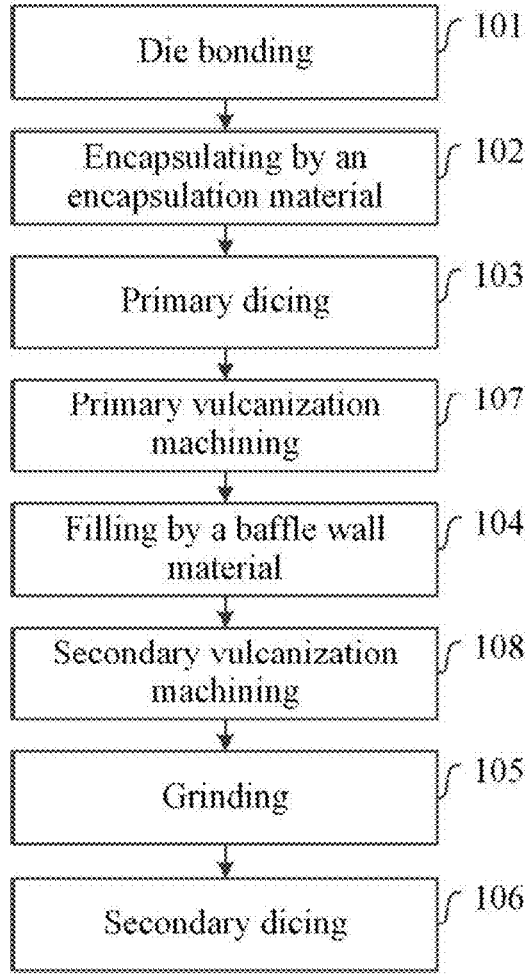
FIG. 7 is a flowchart of another method for machining a device according to an embodiment of the present disclosure.

FIG. 7 is a flowchart of another method for machining a device according to an embodiment of the present disclosure.

In an implementation, different from the preceding embodiment, before filling by the baffle wall material, the method further includes the step below.

S107 is primary vulcanization machining.

Figure 8:
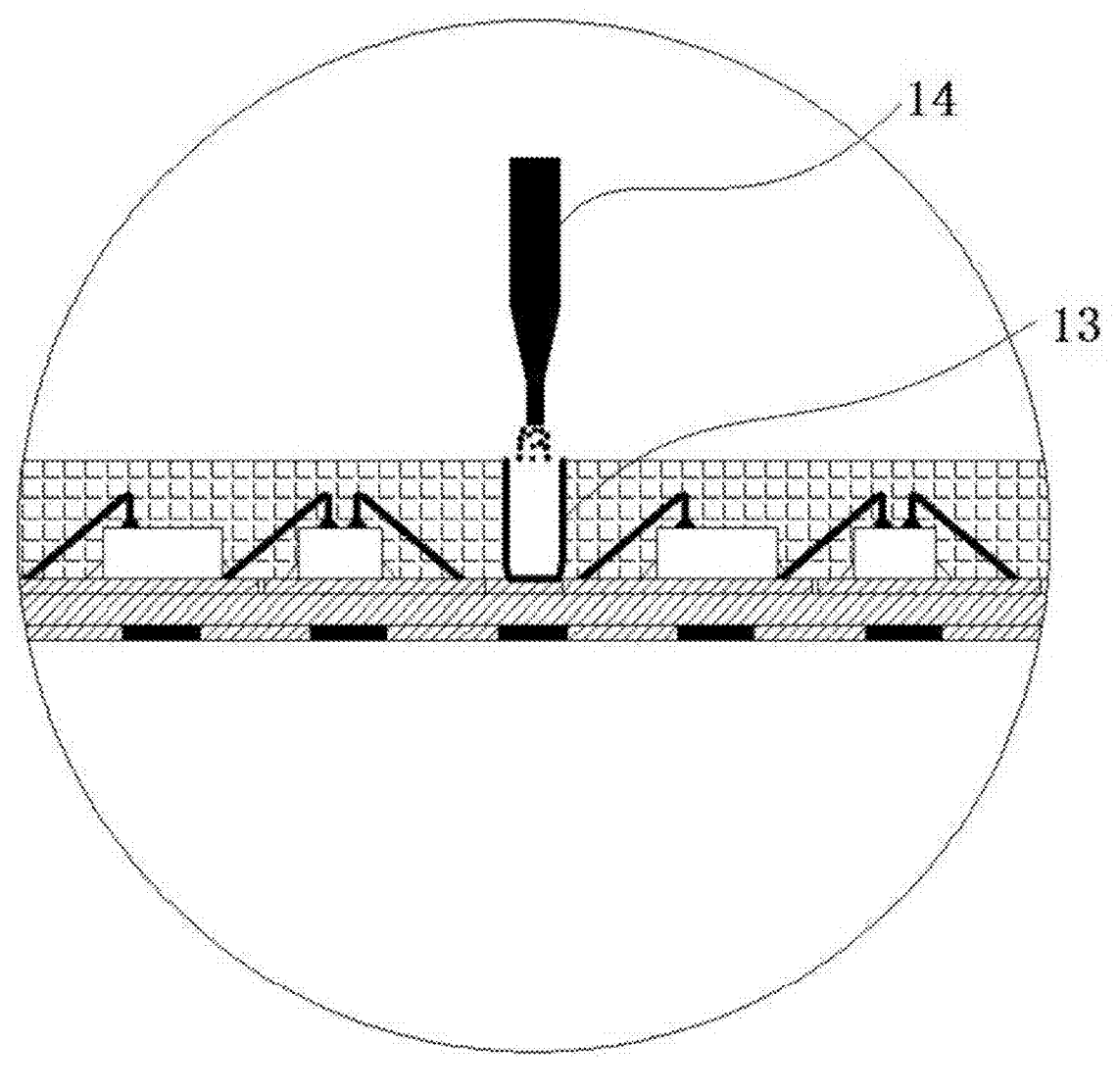
FIG. 8 is a partial sectional view of a main-side anti-vulcanization film according to an embodiment of the present disclosure.

FIG. 8 is a partial sectional view of a main-side anti-vulcanization film according to an embodiment of the present disclosure. Referring to FIG. 8, in the channel structure

12, an anti-vulcanization material is sprayed on an outer side surface of any one of the multiple sub-encapsulation layers and a top surface of a position of the main circuit board 10 corresponding to the channel structure 12 through a spraying process, and the anti-vulcanization material forms a main-side anti-vulcanization film 13.

In an implementation, in conjunction with the subsequent step of secondary dicing, since the step of secondary dicing generally requires a narrower dicing knife to cut the full-board device along the same dicing track, correspondingly, a width of a section of a channel obtained through the secondary dicing is relatively narrow, and in the step of primary dicing, the width of the section of the channel machined by the dicing knife is relatively wide.

Correspondingly, to make the spraying of the vulcanization material more convenient, in the embodiment of the present disclosure, the vulcanization material is sprayed in the channel obtained through the primary dicing, so as to ensure a film-forming and covering effect of the vulcanization material.

Referring to a spraying manner of a nozzle of the structure shown in FIG. 8, the anti-vulcanization material covers a bottom surface of the channel in addition to the outer side surface of the sub-encapsulation layer, that is, the top surface of the position of the main circuit board 10 corresponding to the channel structure 12. Therefore, the final molded main-side anti-vulcanization film covers the bottom surface corresponding to the channel structure 12 in addition to the side surface of the sub-encapsulation layer. In conjunction with a spraying feature of the nozzle 14 shown in FIG. 8, this setting manner can ensure that a side surface of a sub-package can be well sprayed with the anti-vulcanization material, ensuring the molding quality of the sub-side anti-vulcanization film.

Correspondingly, to ensure a machining effect of the primary vulcanization machining, in an implementation, in the radial section of any one of the multiple sub-channels, a minimum value of the width of the bottom of the sub-channel is 0.1 mm, and a minimum value of a difference value between the width of the top of the sub-channel and the width of the bottom of the sub-channel is 0.03 mm.

In addition, the width of the section of the channel in the channel structure 12 of the primary dicing should take into account a requirement of the baffle wall structure obtained through the subsequent secondary dicing and avoid waste of the material in addition to meeting a requirement of the spraying.

It is to be noted that since the nozzle has a regional spraying range, in actual machining, a portion of the anti-vulcanization material is molded on the top surface of the main encapsulation layer 11 (the sub-encapsulation layer 6). A molded structure of the main-side anti-vulcanization film shown in FIG. 8 is a structure of the main-side anti-vulcanization film in an ideal state.

In an implementation, the anti-vulcanization material is a silicone resin. An object of selecting the silicon resin as the anti-vulcanization material is to keep consistent with the material of the encapsulation material, ensuring the compactness of the combination of the anti-vulcanization material and the encapsulation material. In addition, the silicone resin is compact in density and has a better anti-vulcanization effect.

Figure 9:
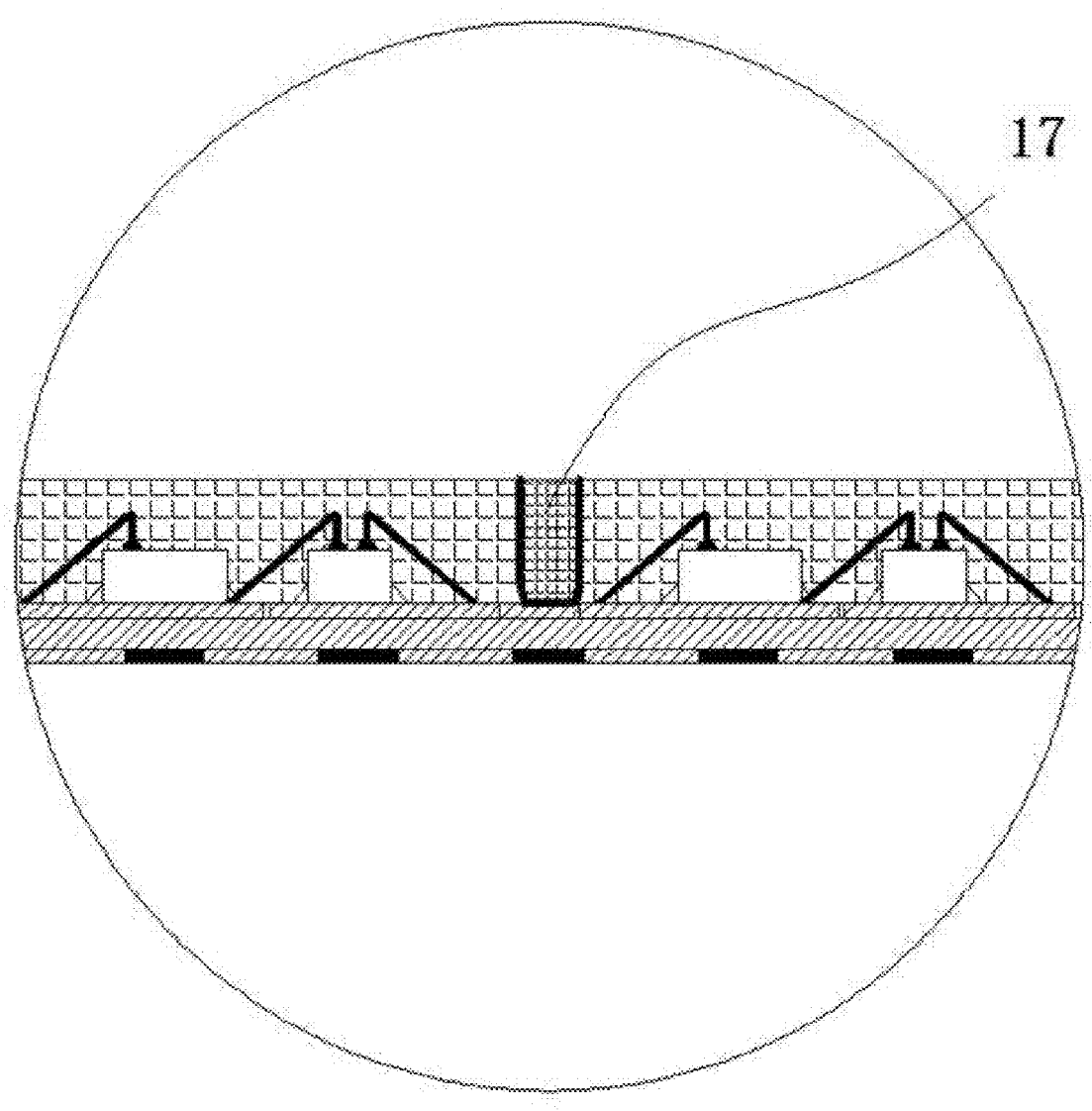
FIG. 9 is a partial sectional view of a main baffle wall according to an embodiment of the present disclosure.

FIG. 9 is a partial sectional view of a main baffle wall 17 according to an embodiment of the present disclosure. Referring to FIG. 9, after the primary vulcanization machining, the channel structure 12 is filled with the baffle wall material and then grinding is performed. The baffle wall material is cured into a main baffle wall 17 in the channel structure 12. The baffle wall material is used for filling the channel structure, the baffle wall material is cured into the main baffle wall 17, and the main circuit board, the multiple chipsets, the multiple sub-encapsulation layers and the main baffle wall are combined to form a semi-finished product. When the baffle wall material is ground off, the anti-vulcanization material molded on the top surface of the main encapsulation layer 11 (the sub-encapsulation layer 6) is removed together.

In an implementation, after the grinding, the method further includes the step below.

S108 is secondary vulcanization machining.

Figure 10:
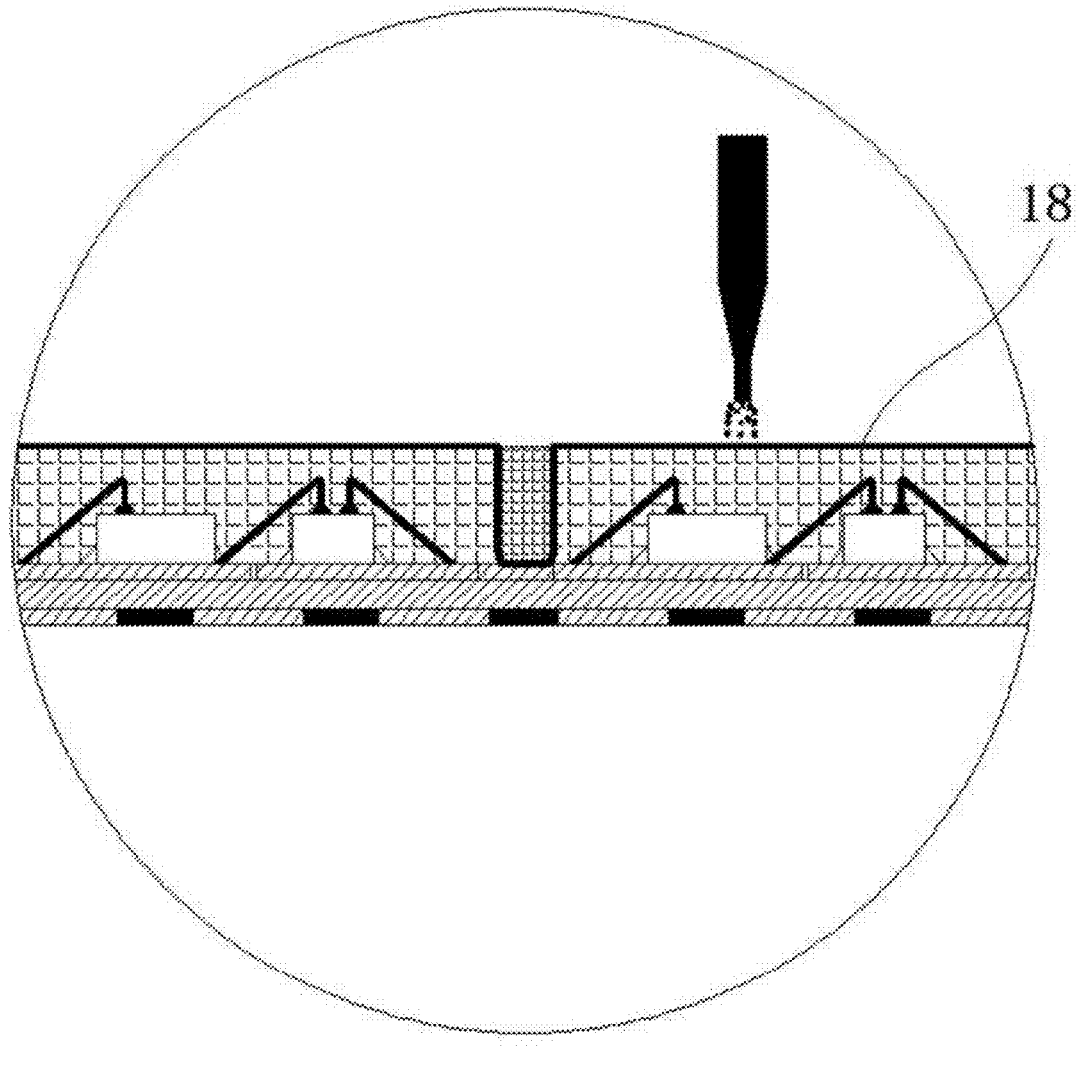
FIG. 10 is a partial sectional view of a main-top anti-vulcanization film according to an embodiment of the present disclosure.

FIG. 10 is a partial sectional view of a main-top anti-vulcanization film 18 according to an embodiment of the present disclosure.

An anti-vulcanization material is sprayed on a sprayed top surface, and the anti-vulcanization material forms a main-top anti-vulcanization film 18 covering the sprayed top surface.

In an implementation, the sprayed top surface is a flat plane surface. The anti-vulcanization material is sprayed on the sprayed top surface through a spraying process, and the anti-vulcanization material is cured into the main-top anti-vulcanization film 18 on the sprayed top surface.

To conclude, in this method for machining a device, the anti-vulcanization material is sprayed on the channel structure before the channel structure is filled with the baffle wall material, and the anti-vulcanization material is sprayed on the sprayed top surface after the filling of the baffle wall material. An anti-vulcanization structure obtained in this implementation has relatively good wrapping and protection to the sub-package so that the self-vulcanization of the sub-package and the adhesion to the outside may be well avoided. A redundant sub-side anti-vulcanization film and sub-top anti-vulcanization film can increase an intrusion path of impurities and provide good protection to the sub-package. In the final step of cutting and dividing to obtain the device, the cutting surface does not have a substantial effect on the function of the device so that an implementation requirement of the cutting operation may be reduced. The device obtained based on this method for machining a device is characterized in excellent anti-vulcanization performance, no adhesion to the outside or the like.

To ensure that an actual implementation situation is consistent with a theoretical situation, multiple aspects involved in the step of grinding require to be improved.

Figure 11:
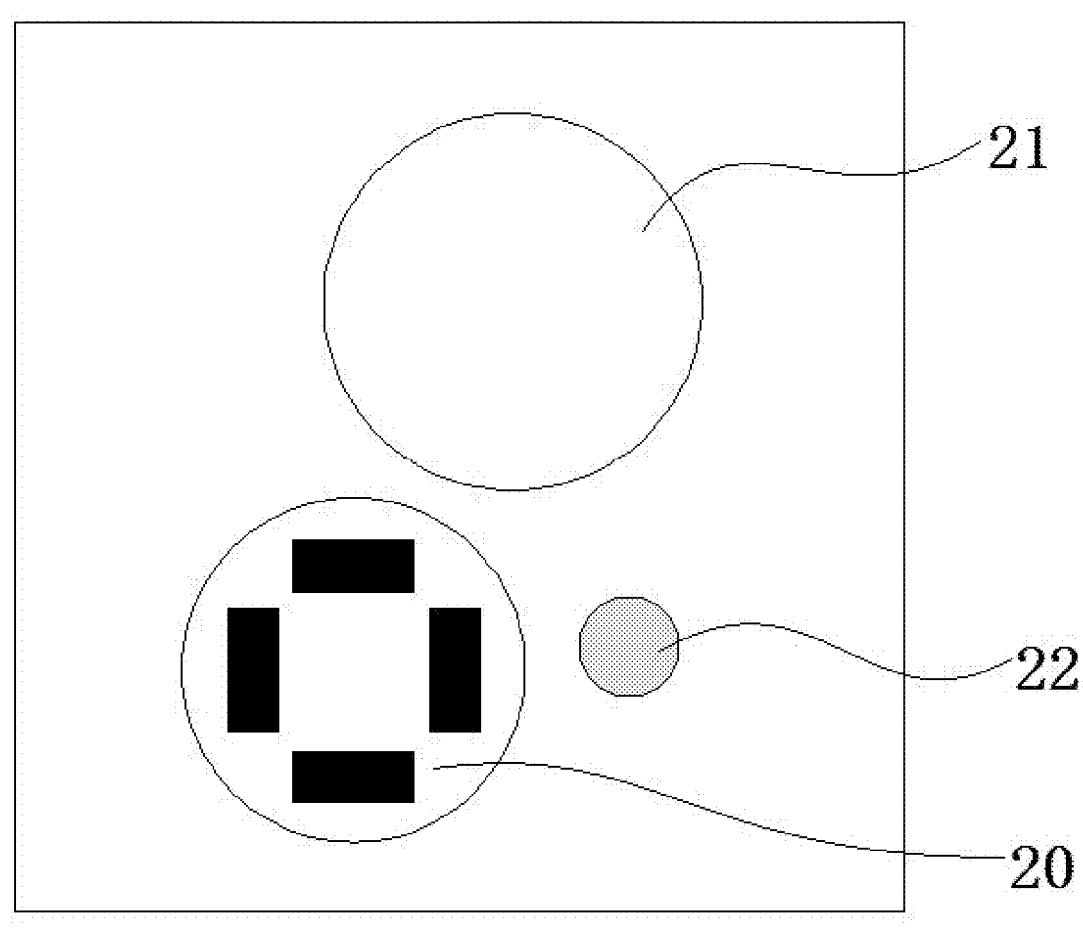
FIG. 11 is a simplified top view of a grinding device according to an embodiment of the present disclosure.

FIG. 11 is a simplified top view of a grinding device according to an embodiment of the present disclosure. In an implementation, the grinding device according to an embodiment of the present disclosure includes a grinding and fixing platform 20 (a vacuum suction cup), a grinding working end 21 (a grinding wheel) and a trimming device 22 (a device for polishing the grinding wheel).

In an implementation, a height of a platform surface of the grinding and fixing platform 20, that is, a height of a top surface of the vacuum suction cup is constant, and in an actual operation, the top surface of the vacuum suction cup is used as the height reference.

In an implementation, in the embodiment of the present disclosure, based on the convenience of implementation, the grinding working end 21 is a grinding wheel with a grinding surface parallel to the grinding and fixing platform 20. For a manufacturing material of the polished objects (i.e., the main encapsulation layer and the main baffle wall), the grinding wheel is preferably a resin grinding wheel.

Correspondingly, when the grinding wheel is selected as the grinding working end 21, since the grinding wheel has a rough surface and is the resin grinding wheel, the grinding wheel has a problem of being glued during an operation, resulting in a poor grinding effect and a relatively large roughness. Therefore, before each grinding and during the grinding process, the polishing surface of the grinding wheel requires to be timely trimmed. On the one hand, the grinding requires to be removed, so as to keep a height of an actual polishing surface of the grinding wheel consistent with a height of a theoretical polishing surface.

In the actual implementation, when the grinding working end 21, that is, the polishing surface of the grinding wheel is glued, on the one hand, the polishing efficiency is reduced, and on the other hand, the polishing surface is uneven, which affects the polishing accuracy. Therefore, in the step of grinding, that the grinding working end 21 grinds from above the semi-finished product toward the grinding and fixing platform 20 and operates to the preset height is implemented through multiple sub-steps, where in each of the multiple sub-steps, the grinding surface of the grinding working end 21 operates to a corresponding theoretical height, and in a last performed sub-step, the grinding surface of the grinding working end 21 operates to the preset height. That is, the overall grinding process requires to be achieved through multiple independent grinding operations, and to ensure the grinding efficiency, each independent grinding operation may be implemented base on the manner below.

In an implementation, each of the multiple sub-steps includes adjusting by the trimming device, polishing by the grinding device and feed grinding.

The adjusting by the trimming device comprises that with the platform surface of the grinding and fixing platform 20 as the height reference, a height of a trimming surface of the trimming device 22 is the same as the theoretical height corresponding to the sub-step. In an implementation, the polishing surface of the trimming device 22 is consistent with the height of the semi-finished product which requires to be polished by the grinding device in the sub-step, ensuring that the polishing height of the grinding surface of the grinding wheel is consistent with the corresponding grinding height of the grinding surface of the grinding wheel in the sub-step, so as to provide a better grinding effect.

The polishing by the grinding device comprises that the grinding device is driven to operate to a position above the trimming device 22 located outside the grinding and fixing platform 20, the grinding device is driven to work, and the grinding surface of the grinding device is made to operate to the corresponding theoretical height, where the grinding surface coincides with the trimming surface. In this step, the grinding surface coincides with the trimming surface, that is, the grinding surface is consistent with the corresponding theoretical height.

The feed grinding comprises that the grinding device is driven to translate to a position above the grinding and fixing platform 20 to polish the semi-finished product.

It is worth mentioning that the roughness detection is further performed on the top surface of the semi-finished product after the grinding; when the top surface of the semi-finished product after the grinding has a roughness of less than or equal to 0.5, the step of secondary dicing is performed; when the top surface of the semi-finished product after the grinding has a roughness of greater than 0.5, the step of grinding is performed again.

It is to be noted that the polishing of the grinding surface of the grinding wheel may be performed through an entire machining flow of the device when necessary, and the reasonable timing for the grinding wheel to polish is determined through empirical determination, statistical calculation, visual observation or the like, so as to take into account both the polishing accuracy and machining speed of the polishing of the grinding wheel, ensuring the high efficiency of the grinding operation.

In an implementation, the grinding wheel may be worn out as the grinding wheel is used, resulting in a change in the polishing surface. Theoretically, with the presence of at least one polishing particle on the polishing surface, the polishing operation may be completed. Correspondingly, if no polishing particle is present on the polishing surface, it indicates that the polishing surface fails, and the polishing surface requires to be adjusted.

In the embodiment of the present disclosure, in an implementation, whether a width of a gap between the trimming device 22 and the grinding wheel is greater than a preset value is observed based on a visual device. If the width of the gap between the trimming device 22 and the grinding wheel is greater than the preset value, the grinding wheel is controlled to move downward with a minimum step, and a height after the grinding wheel is moved downward with the minimum step is used as the theoretical polishing height.

In an implementation, if the gap is greater than the preset value, it indicates that the original polishing surface fails, and the polishing surface requires to be adjusted so that the actual polishing surface is kept consistent with the theoretical polishing surface.

In an implementation, the minimum step mentioned in using the height after the grinding wheel is moved downward with the minimum step as the theoretical polishing height refers to a minimum step that an external device drives the grinding wheel to move with along a vertical direction. Through this implementation means, the polishing surface of the grinding wheel may be adjusted in real time to avoid an inaccurate height of the semi-finished product obtained through the polishing.

In an implementation, for a roughness requirement for polishing, the mesh number of the grinding wheel is in a range of [500, 1000].

Correspondingly, to ensure a grinding effect, a rotational speed of the grinding wheel in an operating state is in a range of [600 rpm, 800 rpm].

Correspondingly, under a corresponding rotational speed, to take into account both the grinding efficiency and grinding effect, a feed rate of the grinding wheel when the grinding wheel grinds from above the semi-finished product toward the grinding and fixing platform and operates to the preset height is in a range of [0.1 μm/s, 0.3 μm/s].

Correspondingly, the preceding embodiment is mainly used for adjusting an implementation structure of the grinding wheel. For the semi-finished product, in an implementation, the grinding and fixing platform is a suction cup, and the suction cup can ensure the adsorption of a bottom surface of the main circuit board in the semi-finished product so that the bottom surface of the main circuit board abuts against the suction cup, ensuring that a height of a bottom surface of the semi-finished product is kept the same as a height of a top surface of the suction cup, where the height of the top surface of the suction cup may be expressed as the height of the bottom surface of the semi-finished product. For the grinding wheel, the height of the top surface of the suction cup is used as the height reference, ensuring that a height of a finished product after the grinding is the same as the theoretical value.

In an implementation, for the device according to the embodiment of the present disclosure, a structure of an internal circuit may be implemented with reference to the structure of the sensing device below.

It is to be understood that various forms of the preceding flows may be used with steps reordered, added, or removed. For example, the steps described in the present disclosure may be executed in parallel, in sequence, or in a different order as long as the desired result of the technical solutions in the present disclosure is achieved. The execution sequence of these steps is not limited herein.

Figure 12:
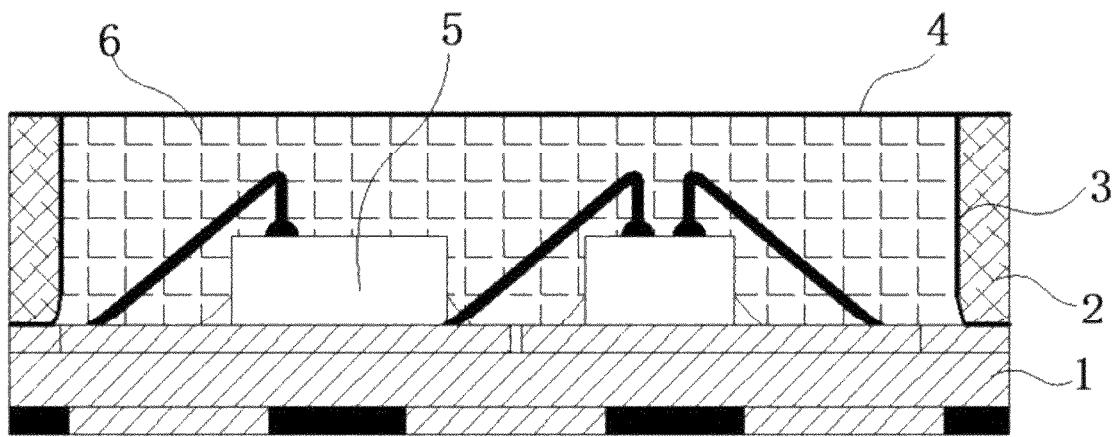
FIG. 12 is a sectional view of another device according to an embodiment of the present disclosure.

FIG. 12 is a sectional view of another device according to an embodiment of the present disclosure.

Correspondingly, the present disclosure further provides a device. The device includes a sub-circuit board 1, a chipset, a sub-encapsulation layer 6, a sub-side anti-vulcanization film 3, a sub-baffle wall 2 and a sub-top anti-vulcanization film 4. To distinguish the naming of the components of the device from the naming of some structures in a subsequent machining method, a corresponding prefix is added to the naming of the components of the device.

In an implementation, the sub-side anti-vulcanization film 3 covers an outer side surface of the sub-encapsulation layer 6, extends from a bottom surface contour of the sub-encapsulation layer 6 toward an edge contour of the sub-circuit board 1 and covers a top surface of the sub-circuit board 1.

In an implementation, an outer side surface of the sub-side anti-vulcanization film 3 is surrounded by the sub-baffle wall 2, and an edge contour of the sub-baffle wall 2 coincides with the edge contour of the sub-circuit board 1.

In an implementation, referring to the structure shown in FIG. 12, the sub-side anti-vulcanization film 3 is disposed between the sub-baffle wall 2 and the sub-encapsulation layer 6 and between the sub-baffle wall 2 and the sub-circuit board 1. On the one hand, the sub-side anti-vulcanization film 3 has a main function of preventing a sidewall of the sub-encapsulation layer 6 from being in contact with the outside and may achieve an anti-vulcanization function. On the other hand, limited by the machining process, the structure of a portion of the sub-side anti-vulcanization film 3 is also correspondingly formed on the top surface (a position between the bottom surface contour of the sub-encapsulation layer 6 and the edge contour of the sub-circuit board 1) of the sub-circuit board 1. This portion of sub-side anti-vulcanization film 3 can increase a distance of external impurities intruding from a gap between the sub-side anti-vulcanization film 3 and the sub-circuit board 1 to the sub-encapsulation layer 6, improving the anti-vulcanization function of the sub-side anti-vulcanization film 3.

In an implementation, in the embodiment of the present disclosure, the sub-top anti-vulcanization film 4 covers a top surface of the sub-encapsulation layer 6, a top surface of the sub-side anti-vulcanization film 3 and a top surface of the sub-baffle wall 2. Basically, the structure of a portion of the sub-top anti-vulcanization film 4 located on the top surface of the sub-encapsulation layer 6 may be used for ensuring that a contact between the outside and the sub-encapsulation layer 6 is prevented, the sub-top anti-vulcanization film 4 and the sub-side anti-vulcanization film 3 may be regarded as an integrated structure, and the structure of a portion of the sub-top anti-vulcanization film 4 located on the top surface of the sub-baffle wall 2 may be used for increasing the distance of the external impurities intruding from the gap to the sub-encapsulation layer 6.

In an implementation, the embodiment of the present disclosure provides a device. With a specially designed structure of an anti-vulcanization layer in the device, on the one hand, an object of avoiding the exposure of the sub-encapsulation layer 6 is achieved, preventing the adhesion caused by the contact between a material of the sub-encapsulation layer 6 and the outside, and on the other hand, the contact between the sub-encapsulation layer 6 and the outside can be avoided, lowering a vulcanization speed of the sub-encapsulation layer 6 and improving the durability of the sub-encapsulation layer 6.

In an implementation, the above method for machining a device may be used for machining a sensing device, and in an implementation, a structure of the sensing device is described below.

Figure 13:
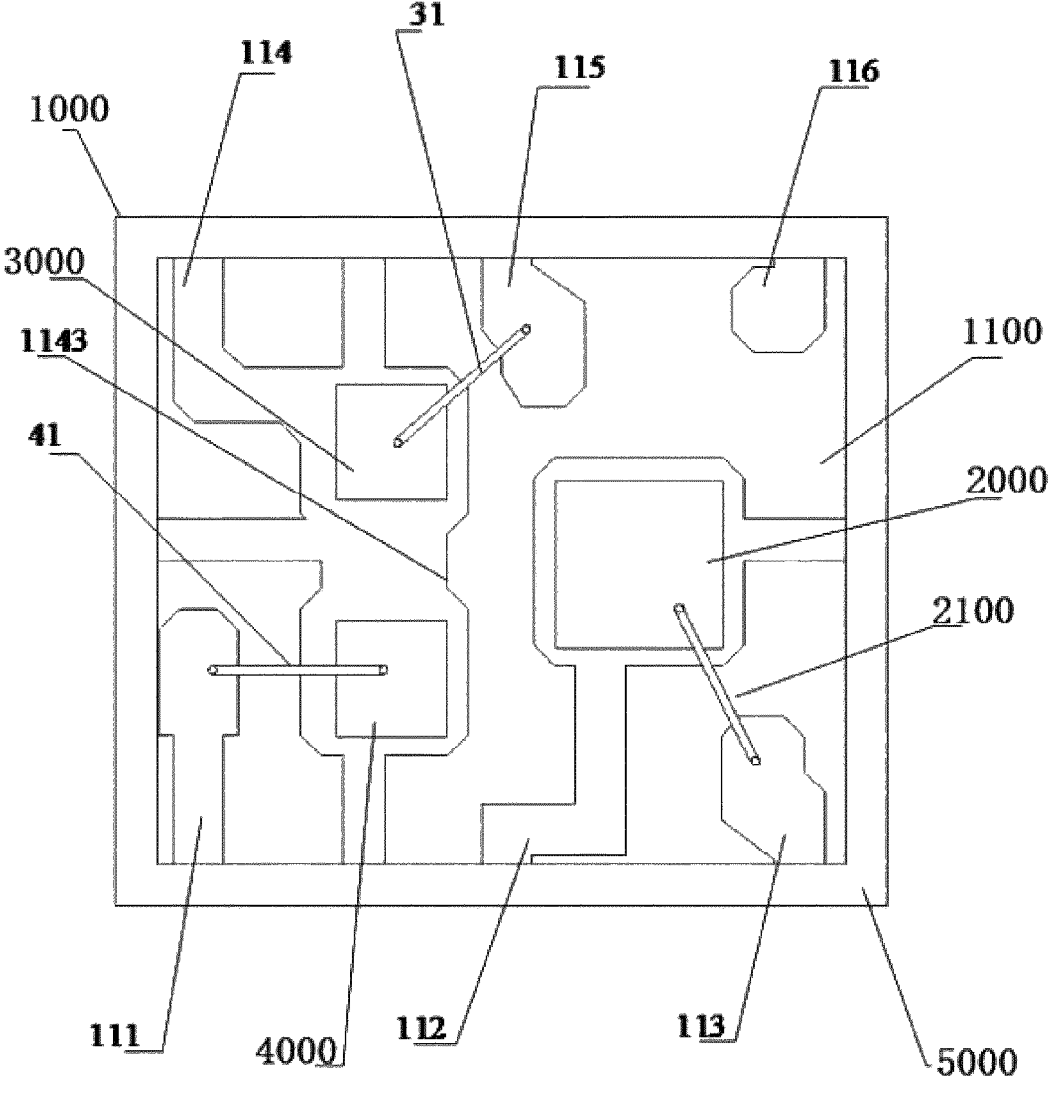
FIG. 13 is a structural diagram of a sensing device according to an embodiment of the present disclosure.
Figure 14:
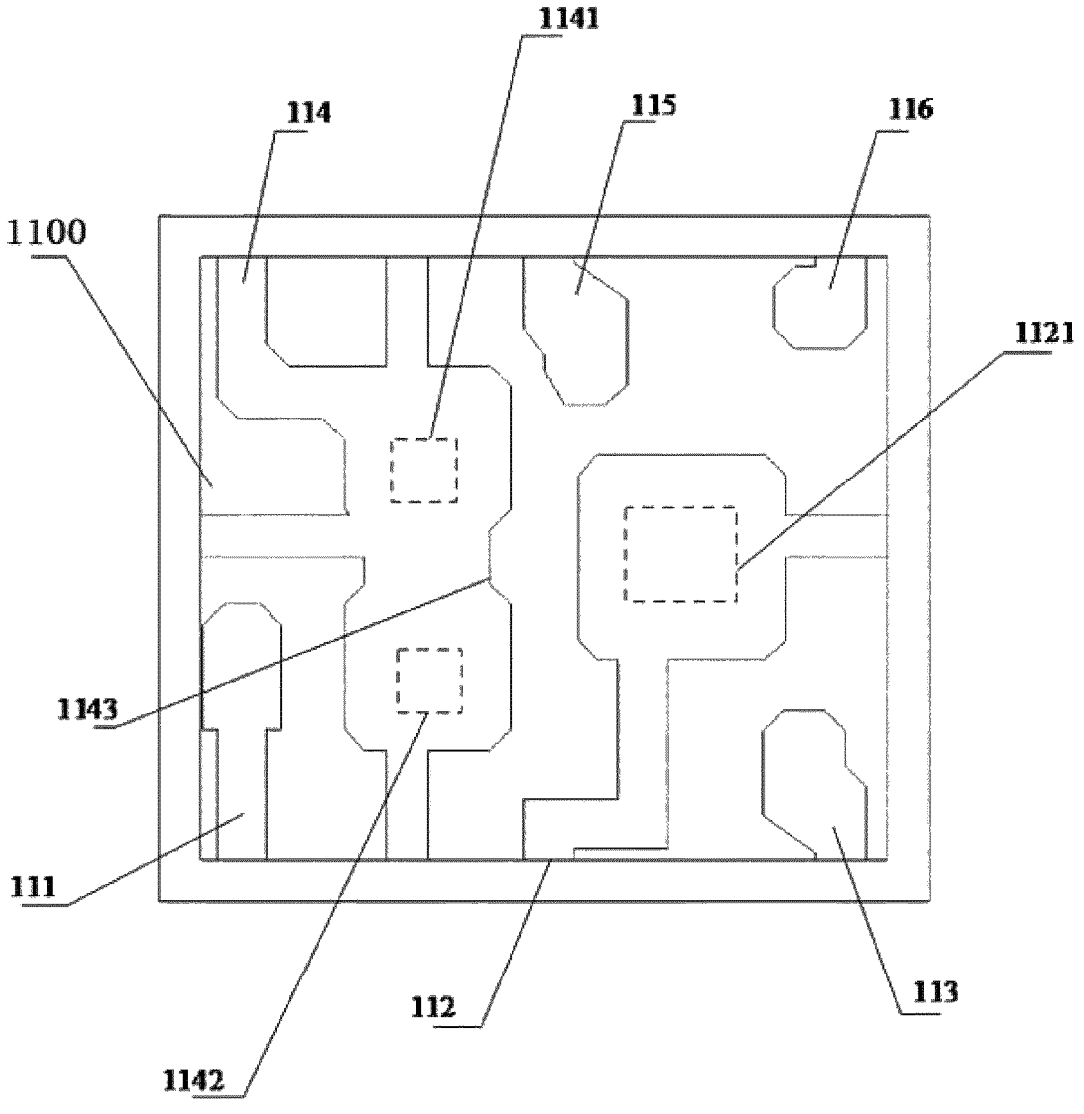
FIG. 14 is a schematic diagram of a front structure of a substrate according to an embodiment of the present disclosure.

FIG. 13 is a structural diagram of a sensing device according to an embodiment of the present disclosure. FIG. 14 is a schematic diagram of a front structure of a substrate according to an embodiment of the present disclosure. The sensing device includes a substrate 1000, a green light chip 2000, a red light chip 3000 and an infrared light chip 4000, where the green light chip 2000, the red light chip 3000 and the infrared light chip 4000 are arranged on the substrate 1000 in delta arrangement. A first front-side pad 111, a second front-side pad 112, a third front-side pad 113, a fourth front-side pad 114, a fifth front-side pad 115 and a sixth front-side pad 116 are disposed on the substrate 1000. A first chip slot 1141 and a second chip slot 1142 are disposed on the fourth front-side pad 114, and a third chip slot 1121 is disposed on the second front-side pad 112. The red light chip 3000 is bonded on the first chip slot 1141, the infrared light chip 4000 is bonded on the second chip slot 1142, and the green light chip 2000 is bonded on the third chip slot 1121.

Further, a groove portion 1143 is disposed on the fourth front-side pad 114, and the groove portion 1143 is disposed between the first chip slot 1141 and the second chip slot 1142, so as to facilitate die bonding identification. When the die bonding is performed, positions of the first chip slot 1141 and the second chip slot 1142 may be accurately identified, improving the reliability of the device.

Further, the red light chip 3000 and the infrared light chip 4000 are each a chip having a vertical structure, and the vertical structure has the advantages of high brightness, low voltage drop, low power consumption or the like. The green light chip 2000 may be the chip having a vertical structure, or may be a chip having a horizontal structure.

In an implementation, the red light chip 3000 is fixed on the first chip slot 1141, the infrared light chip 4000 is fixed on the second chip slot 1142, that is, the red light chip 3000 and the infrared light chip 4000 are arranged on the fourth front-side pad 114, and the green light chip 2000 is fixed on the third chip slot 1121, that is, the green light chip 2000 is arranged on the second front-side pad 112. Further, the red light chip 3000 is connected to the fifth front-side pad 115 through a first metal wire 31, the infrared light chip 4000 is connected to the first front-side pad 111 through a second metal wire 41, and the green light chip 2000 is connected to the third front-side pad 113 through a third metal wire 2100.

In an implementation, the green light chip 2000 emits green light, and a receiving device corresponding to the sensing device receives reflected green light reflected from a human body, which may be used for testing a heart rate. The red light chip 3000 emits red light, and the receiving device corresponding to the sensing device receives reflected red light reflected from the human body, which is used for testing a hemoglobin concentration. The infrared light chip 4000 emits infrared light, and the receiving device corresponding to the sensing device receives infrared light reflected from the human body, which is used for detecting a blood oxygen saturation. Through the green light chip 2000, the red light chip 3000 and the infrared light chip 4000, the sensing device can monitor the blood oxygen and the heart rate of the human body.

Further, a dimension of the green light chip 2000 is greater than a dimension of the red light chip 3000 or a dimension of the infrared light chip 4000 so that the green light chip 200 can emit green light having high brightness and meet a requirement for brightness of the reflected green light of the receiving device, achieving the detection of the heart rate of the human body.

In an implementation, a light-emitting angle of the sensing device is a, a constraint relationship of a is $120° \leq a \leq 130°$, which meets a detection requirement for human body of the sensing device and enables the receiving device to receive enough reflected light, and with less interference light, a detection result is accurate.

Further, the sensing device is encapsulated by an encapsulation material through a secondary encapsulation process to form an encapsulation layer 6000 (i.e., a sub-encapsulation layer 6). A white baffle wall 5000 is disposed to surround an encapsulation layer 6000 of a front 1100 of the substrate, the white baffle wall 5000 is connected to the substrate 1000 at a connection position set as a transition connection with an arc, and the white baffle wall 5000 reduces the absorption and refraction of light emitted by the green light chip 2000, the red light chip 3000 and the infrared light chip 4000 and increases the light emission intensity of the green light chip 2000, the red light chip 3000 and the infrared light chip 4000.

Further, a height of the chip on the sensing device is h, a height of the encapsulation layer 6000 is H, and a constraint relationship between H and h is $1.5\ h<H<4\ h$, where a value of H is in a range of $200\ \mu m<H<600\ \mu m$.

Figure 15:
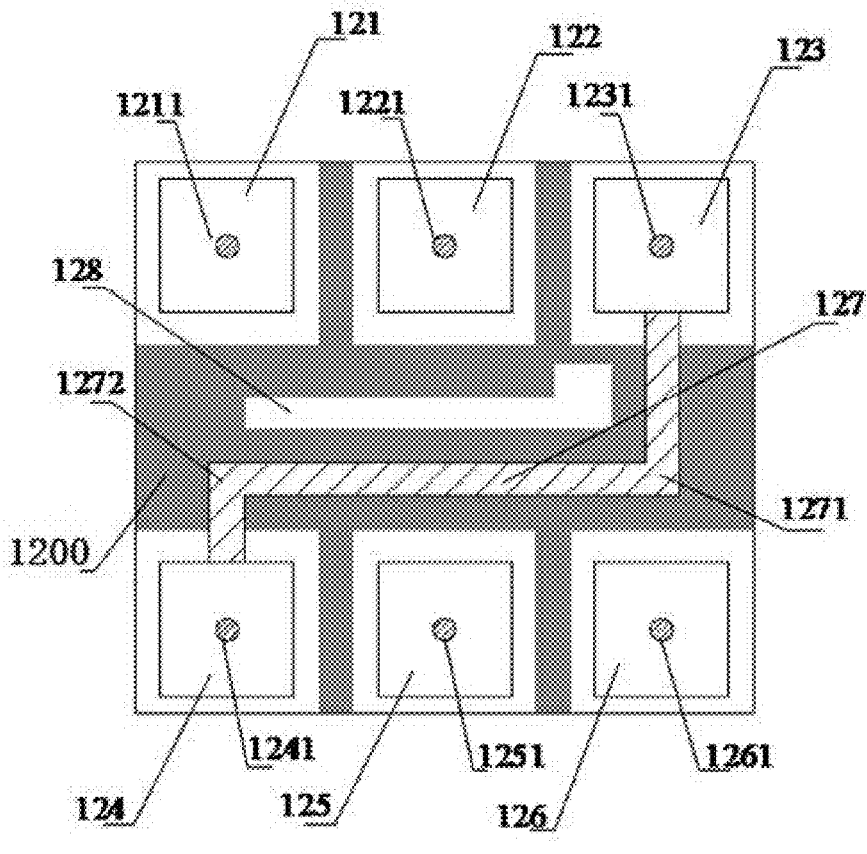
FIG. 15 is a schematic diagram of a back structure of a substrate according to an embodiment of the present disclosure.

In an implementation, FIG. 15 is a schematic diagram of a back structure of a substrate according to an embodiment of the present disclosure. Six back-side pads are disposed on a back 1200 of the substrate 1000, where the six back-side pads include a first back-side pad 121, a second back-side pad 122, a third back-side pad 123, a fourth back-side pad 124, a fifth back-side pad 125 and a sixth back-side pad 126, where the first back-side pad 121, the second back-side pad 122, the third back-side pad 123, the fourth back-side pad 124, the fifth back-side pad 125 and the sixth back-side pad 126 correspond to the first front-side pad 111, the second front-side pad 112, the third front-side pad 113, the fourth front-side pad 114, the fifth front-side pad 115 and the sixth front-side pad 116.

The first back-side pad 121, the second back-side pad 122, the third back-side pad 123, the fourth back-side pad 124, the fifth back-side pad 125 and the sixth back-side pad 126 are disposed in two columns on both sides of the back 1200 of the substrate. Further, the third back-side pad 123 and the fourth back-side pad 124 are disposed at diagonal positions.

In an implementation, the six back-side pads are independent of each other. In a machining and manufacturing process, back-side pads between two adjacent devices are not connected to each other, that is, the six back-side pads are located inside an outer edge of the substrate 1000 and are not connected to the outer edge of the substrate 1000, which facilitates cutting and dividing into separate sensing devices and avoids burrs on sidewalls of the devices.

It is to be noted that to facilitate the machining and manufacturing, corresponding front-side pads on connected two sides between any two adjacent devices are connected to each other, and after being divided into separate devices, copper foils of the six front-side pads are exposed on sidewalls corresponding to the substrate 1000.

In an implementation, six metal guide columns are disposed on the six back-side pads, where the six metal guide columns include a first metal guide column 1211, a second metal guide column 1221, a third metal guide column 1231, a fourth metal guide column 1241, a fifth metal guide column 1251 and a sixth metal guide column 1261, where the first metal guide column 1211, the second metal guide column 1221, the third metal guide column 1231, the fourth metal guide column 1241, the fifth metal guide column 1251 and the sixth metal guide column 1261 are used for connecting to the six front-side pads of the front 1100 of the substrate 1000.

Further, the six metal guide columns are disposed at any position of projections of the six back-side pads.

In an implementation, the six back-side pads may be correspondingly connected to the six front-side pads base on ink plug holes, or may be correspondingly connected to the six front-side pads based on resin plug holes.

Figure 16:
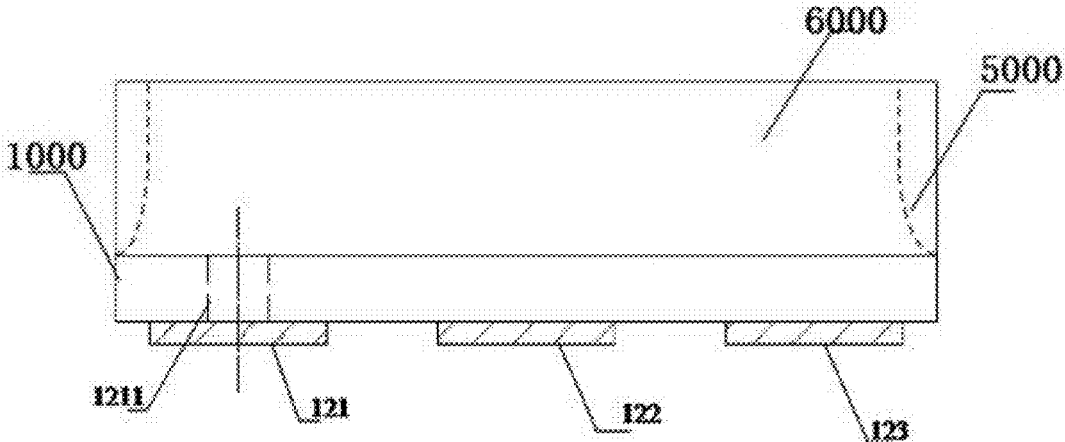
FIG. 16 is a schematic diagram of a side structure of a sensing device according to an embodiment of the present disclosure.

FIG. 16 is a schematic diagram of a side structure of a sensing device according to an embodiment of the present disclosure. The first metal guide column 1211 extends through the substrate 1000, and the first front-side pad 111 and the first back-side pad 121 are connected to each other and conducted based on the first metal guide column 1211.

The second front-side pad 112 and the second back-side pad 122, the third front-side pad 113 and the third back-side pad 123, the fourth front-side pad 114 and the fourth back-side pad 124, the fifth front-side pad 115 and the fifth back-side pad 125 and the sixth front-side pad 116 and the sixth back-side pad 126 have the same structure of metal guide column as the first front-side pad 111 and the first back-side pad 121. For specific structural features and functions, reference may be made to the structural features and functions of the metal guide column between the first front-side pad 111 and the first back-side pad 121, which are not repeated here.

Further, the red light chip 3000 and the infrared light chip 4000 are connected to the fourth back-side pad 124 based on the fourth front-side pad 114, the red light chip 3000 is connected to the fifth back-side pad 125 based on the fifth front-side pad 115, the infrared light chip 4000 is connected to the first back-side pad 121 based on the first front-side pad 111, the green light chip 2000 is connected to the second back-side pad 122 based on the second front-side pad 112, and the green light chip 2000 is connected to the third back-side pad 123 based on the third front-side pad 113. The green light chip 2000, the red light chip 3000 and the infrared light chip 4000 can work normally.

In an implementation, the first chip slot 1141 and the second chip slot 1142 may be disposed on the third front-side pad 113, and the third chip slot 1121 may be disposed on the fourth front-side pad 114. Alternatively, the first chip slot 1141 and the second chip slot 1142 may be disposed on the fourth front-side pad 114, and the third chip slot 1121 may be disposed on the third front-side pad 113.

In an implementation, the first back-side pad 121, the second back-side pad 122, the third back-side pad 123, the fourth back-side pad 124, the fifth back-side pad 125 and the sixth back-side pad 126 are disposed on the back 1200 of the substrate, where the third back-side pad 123 and the fourth back-side pad 124 are co-polarity back-side pads. Further, the third back-side pad 123 and the fourth back-side pad 124 are co-anode back-side pads, the first back-side pad 121, the second back-side pad 122 and the fifth back-side pad 125 are cathode back-side pads, and the sixth back-side pad 126 is an idle back-side pad.

In an implementation, the third back-side pad 123 and the fourth back-side pad 124 are co-cathode back-side pads, the first back-side pad 121, the second back-side pad 122 and the fifth back-side pad 125 are anode back-side pads, and the sixth back-side pad 126 is an idle back-side pad.

Further, the first back-side pad 121, the second back-side pad 122, the third back-side pad 123, the fourth back-side pad 124, the fifth back-side pad 125 and the sixth back-side pad 126 are disposed on the back 1200 of the substrate to facilitate heat dissipation.

Preferably, the third back-side pad 123 and the fourth back-side pad 124 are co-anode back-side pads, and the sensing device has a low cost in driving design.

Further, the sixth back-side pad 126 is an idle back-side pad and does not have electrical properties. The first back-side pad 121, the second back-side pad 122, the third back-side pad 123, the fourth back-side pad 124, the fifth back-side pad 125 and the sixth back-side pad 126 are disposed to achieve the symmetry of the back-side pads, and the sixth back-side pad 126 is used for keeping the substrate 1000 stable when tin is applied to the device through welding, so as to keep a horizontal state.

In an implementation, the first back-side pad 121, the second back-side pad 122, the third back-side pad 123, the fourth back-side pad 124, the fifth back-side pad 125 and the sixth back-side pad 126 are symmetrically distributed on the back 1200 of the substrate, where the first back-side pad 121, the second back-side pad 122 and the third back-side pad 123 are arranged in one row on one side of the back 1200 of the substrate, the fourth back-side pad 124, the fifth back-side pad 125 and the sixth back-side pad 126 are arranged in one row on the other side of the back 1200 of the substrate, the third back-side pad 123 and the fourth back-side pad 124 are disposed at diagonal positions of the back 1200 of the substrate, and the third back-side pad 123 is connected to the fourth back-side pad 124 through a conductive line 127. The third back-side pad 123 and the fourth back-side pad 124 are disposed at the diagonal positions, avoiding that connecting wires of a circuit outside the sensing device form interleaving wires and reducing the complexity of an entire circuit.

The back 1200 of the substrate is coated with green ink, and the first back-side pad 121, the second back-side pad 122, the third back-side pad 123, the fourth back-side pad 124, the fifth back-side pad 125 and the sixth back-side pad 126 are blocked by the green ink, so as to avoid line breakage caused by the connection of back-side pads when the welding is performed on the sensing device.

Further, a position close to the middle of the back 1200 of the substrate is left blank to form an electrical identifier 128, and the electrical identifier 128 is used for identifying polarities of the first back-side pad 121, the second back-side pad 122, the third back-side pad 123, the fourth back-side pad 124, the fifth back-side pad 125 and the sixth back-side pad 126. The conductive line 127 is divided into three sections, and the three sections are connected based on a first right-angle turning portion 1271 and a second right-angle turning portion 1272. An intermediate section of the three sections is close to one row of back-side pads, and the first right-angle turning portion 1271 and the second right-angle turning portion 1272 increase a connection distance between the third back-side pad 123 and the fourth back-side pad 124, ensuring that the third back-side pad 123 can be safely connected to the fourth back-side pad 124. Further, a distance between the intermediate section of the conductive line 127 and the other row of back-side pads of the first back-side pad 121, the second back-side pad 122, the third back-side pad 123, the fourth back-side pad 124, the fifth back-side pad 125 and the sixth back-side pad 126 ensures that a sufficient space is left blank to form the electrical identifier 128.

In an implementation, a thickness of the conductive line 127 is less than a thickness of any one of the first back-side pad 121, the second back-side pad 122, the third back-side pad 123, the fourth back-side pad 124, the fifth back-side pad 125 and the sixth back-side pad 126, so as to prevent the device from being lifted in the welding process due to instability, which affects the use of a client.

The scope of the present disclosure is not limited to the preceding embodiments. It is to be understood by those skilled in the art that various modifications, combinations, subcombinations, and substitutions may be made according to design requirements and other factors. Any modification, equivalent substitution, improvement and the like made within the spirit and principle of the present disclosure falls within the scope of the present disclosure.

What is claimed is:

1. A device, comprising a sub-circuit board, a chipset, a sub-encapsulation layer, a sub-baffle wall and a sub-top anti-vulcanization film;

wherein the chipset comprises a plurality of chips, wherein the plurality of chips are separately bonded on the sub-circuit board and encapsulated based on the sub-encapsulation layer;

a bottom surface contour of the sub-encapsulation layer is located in a region surrounded by an edge contour of the sub-circuit board;

the sub-baffle wall covers an outer side surface of the sub-encapsulation layer, extends from a bottom of the outer side surface of the sub-encapsulation layer toward an edge of the sub-circuit board and covers a top surface of the sub-circuit board; and the sub-top anti-vulcanization film covers a top surface of the sub-encapsulation layer and a top surface of the sub-baffle wall;

wherein the sub-circuit board comprises a substrate, and the plurality of chips comprises a green light chip, a red light chip, and an infrared light chip;

wherein the device further comprises: a first front-side pad, a second front-side pad, a third front-side pad, a fourth front-side pad, a fifth front-side pad and a sixth front-side pad which are disposed on the substrate: a first chip slot and a second chip slot are disposed on the fourth front-side pad, and a third chip slot is disposed on the second front-side pad; and the red light chip is bonded on the first chip slot, the infrared light chip is bonded on the second chip slot, and the green light chip is bonded on the third chip slot;

wherein the device further comprises: a first back-side pad, a second back-side pad, a third back-side pad, a fourth back-side pad, a fifth back-side pad and a sixth back-side pad which are disposed on a back of the substrate, wherein the first back-side pad, the second back-side pad, the third back-side pad, the fourth back-side pad, the fifth back-side pad and the sixth back-side pad correspond to the first front-side pad, the second front-side pad, the third front-side pad, the fourth front-side pad, the fifth front-side pad and the sixth front-side pad respectively; and wherein the back of the substrate is coated with green ink.

2. The device according to claim 1, further comprising a sub-side anti-vulcanization film, wherein the sub-side anti-vulcanization film covers the outer side surface of the sub-encapsulation layer, extends from the bottom of the outer side surface of the sub-encapsulation layer toward the edge of the sub-circuit board and covers the top surface of the sub-circuit board, and an outer side surface of the sub-side anti-vulcanization film is surrounded by the sub-baffle wall; and wherein the sub-top anti-vulcanization film further covers a top surface of the sub-side anti-vulcanization film.

3. The device according to claim 1, wherein the green light chip, the red light chip, and the infrared light chip are arranged on the substrate in delta arrangement.

4. The device according to claim 1, wherein a groove portion is disposed between the first chip slot and the second chip slot.

5. The device according to claim 1, wherein the red light chip and the infrared light chip are each a chip having a vertical structure.

6. The device according to claim 1, wherein the red light chip is connected to the fifth front-side pad through a first metal wire, the infrared light chip is connected to the first front-side pad through a second metal wire, and the green light chip is connected to the third front-side pad through a third metal wire.

7. The device according to claim 1, wherein a dimension of the green light chip is greater than a dimension of the red light chip or a dimension of the infrared light chip.

8. The device according to claim 1, wherein a height of a chip of the green light chip, the red light chip, and the infrared light chip is h, a height of the sub-encapsulation layer is H, and a constraint relationship between H and h is $1.5\ h<H<4\ h$, where a value of H is in a range of $200\ \mu m<H<600\ \mu m$.

9. The device according to claim 1, wherein the first back-side pad, the second back-side pad, the third back-side pad, the fourth back-side pad, the fifth back-side pad and the sixth back-side pad are disposed in two columns on both sides of the back of the substrate, and the third back-side pad and the fourth back-side pad are disposed at diagonal positions.

10. The device according to claim 9, wherein the third back-side pad is connected to the fourth back-side pad through a conductive line.

11. The device according to claim 10, wherein a position close to a middle of the back of the substrate is left blank to form an electrical identifier, and the electrical identifier is used for identifying polarities of the first back-side pad, the second back-side pad, the third back-side pad, the fourth back-side pad, the fifth back-side pad and the sixth back-side pad.

12. The device according to claim 11, wherein the conductive line is divided into three sections, and the three sections are connected based on a first right-angle turning portion and a second right-angle turning portion, and an intermediate section of the three sections is close to one column of the two columns of the first back-side pad, the second back-side pad, the third back-side pad, the fourth back-side pad, the fifth back-side pad and the sixth back-side pad.

13. The device according to claim 10, wherein a thickness of the conductive line is less than a thickness of any one of the first back-side pad, the second back-side pad, the third back-side pad, the fourth back-side pad, the fifth back-side pad and the sixth back-side pad.

14. The device according to claim 1, further comprising: a first metal guide column which is disposed on the first back-side pad and used for connecting to the first front-side pad, a second metal guide column which is disposed on the second back-side pad and used for connecting to the second front-side pad, a third metal guide column which is disposed on the third back-side pad and used for connecting to the third front-side pad, a fourth metal guide column which is disposed on the fourth back-side pad and used for connecting to the fourth front-side pad, a fifth metal guide column which is disposed on the fifth back-side pad and used for connecting to the fifth front-side pad, and a sixth metal guide column which is disposed on the sixth back-side pad and used for connecting to the sixth front-side pad.

15. A device, comprising a sub-circuit board, a chipset, a sub-encapsulation layer, a sub-baffle wall and a sub-top anti-vulcanization film;

wherein the chipset comprises a plurality of chips, wherein the plurality of chips are separately bonded on the sub-circuit board and encapsulated based on the sub-encapsulation layer;

a bottom surface contour of the sub-encapsulation layer is located in a region surrounded by an edge contour of the sub-circuit board;

the sub-baffle wall covers an outer side surface of the sub-encapsulation layer, extends from a bottom of the outer side surface of the sub-encapsulation layer toward an edge of the sub-circuit board and covers a top surface of the sub-circuit board; and the sub-top anti-vulcanization film covers a top surface of the sub-encapsulation layer and a top surface of the sub-baffle wall;

wherein the sub-circuit board comprises a substrate, and the plurality of chips comprises a green light chip, a red light chip, and an infrared light chip;

wherein the device further comprises: a first front-side pad, a second front-side pad, a third front-side pad, a fourth front-side pad, a fifth front-side pad and a sixth front-side pad which are disposed on the substrate: a first chip slot and a second chip slot are disposed on the fourth front-side pad, and a third chip slot is disposed on the second front-side pad; and the red light chip is bonded on the first chip slot, the infrared light chip is bonded on the second chip slot, and the green light chip is bonded on the third chip slot;

wherein the device further comprises: a first back-side pad, a second back-side pad, a third back-side pad, a fourth back-side pad, a fifth back-side pad and a sixth back-side pad which are disposed on a back of the substrate, wherein the first back-side pad, the second back-side pad, the third back-side pad, the fourth back-side pad, the fifth back-side pad and the sixth back-side pad correspond to the first front-side pad, the second front-side pad, the third front-side pad, the fourth front-side pad, the fifth front-side pad and the sixth front-side pad respectively;

wherein the back of the substrate is coated with ink; and wherein a groove portion is disposed between the first chip slot and the second chip slot.

16. The device according to claim 15, further comprising a sub-side anti-vulcanization film, wherein the sub-side anti-vulcanization film covers the outer side surface of the sub-encapsulation layer, extends from the bottom of the outer side surface of the sub-encapsulation layer toward the edge of the sub-circuit board and covers the top surface of the sub-circuit board, and an outer side surface of the sub-side anti-vulcanization film is surrounded by the sub-baffle wall; and wherein the sub-top anti-vulcanization film further covers a top surface of the sub-side anti-vulcanization film.

17. The device according to claim 15, wherein the green light chip, the red light chip, and the infrared light chip are arranged on the substrate in delta arrangement.

18. The device according to claim 15, wherein the red light chip and the infrared light chip are each a chip having a vertical structure.

19. The device according to claim 15, wherein the red light chip is connected to the fifth front-side pad through a first metal wire, the infrared light chip is connected to the first front-side pad through a second metal wire, and the green light chip is connected to the third front-side pad through a third metal wire.

* * * * *